US012794468B2

(12) United States Patent
Blin

(10) Patent No.: US 12,794,468 B2
(45) Date of Patent: Nov. 10, 2026

(54) MULTI-GATE RADIO FREQUENCY SWITCHES

(71) Applicant: Skyworks Solutions, Inc., Irvine, CA (US)

(72) Inventor: Guillaume Alexandre Blin, Carlisle, MA (US)

(73) Assignee: SKYWORKS SOLUTIONS, INC., Irvine, CA (US)

(*) Notice: Subject to any disclaimer, the term of this patent is extended or adjusted under 35 U.S.C. 154(b) by 560 days.

(21) Appl. No.: 18/357,426

(22) Filed: Jul. 24, 2023

(65) Prior Publication Data

US 2024/0038865 A1 Feb. 1, 2024

Related U.S. Application Data

(60) Provisional application No. 63/369,439, filed on Jul. 26, 2022, provisional application No. 63/369,435, filed on Jul. 26, 2022.

(51) Int. Cl.

| | |
|---|---|
| ***H03K 17/693*** | (2006.01) |
| ***H03K 17/10*** | (2006.01) |
| ***H03K 17/687*** | (2006.01) |
| ***H04B 1/48*** | (2006.01) |
| ***H10D 30/66*** | (2025.01) |
| ***H10D 62/10*** | (2025.01) |
| ***H10D 62/13*** | (2025.01) |
| ***H10D 64/27*** | (2025.01) |
| ***H10D 86/00*** | (2025.01) |

(52) U.S. Cl.

CPC ......... *H03K 17/693* (2013.01); *H03K 17/102* (2013.01); *H04B 1/48* (2013.01); *H10D 30/665* (2025.01); *H10D 62/127* (2025.01); *H10D 62/154* (2025.01); *H10D 62/158* (2025.01); *H10D 64/519* (2025.01); *H10D 86/215* (2025.01); *H03K 2017/6878* (2013.01); *H03K 2217/0045* (2013.01)

(58) Field of Classification Search

CPC ......... H03K 17/693; H03K 2017/6878; H03K 2217/0045; H03K 2217/0018; H03K 17/102; H04B 1/48; H10D 30/665; H10D 62/127; H10D 62/154; H10D 62/158; H10D 64/519; H10D 84/811; H10D 86/215; G01R 23/00–20

See application file for complete search history.

(56) References Cited

U.S. PATENT DOCUMENTS 3,813,586 A * 5/1974 Conner .................. H10D 84/83 257/E27.06

4,462,041 A * 7/1984 Glenn .................. H10D 62/126 257/E29.12

(Continued)

*Primary Examiner* — Maliheh Malek

(74) *Attorney, Agent, or Firm* — Knobbe, Martens, Olson & Bear, LLP

(57) ABSTRACT

Apparatus and methods for multi-gate radio frequency (RF) switches are disclosed herein. The RF switches use various layout design techniques to improve figure of merit (FOM). Examples of such techniques include using only two field-effect transistors (FETs) in series to maintain shorter fingers for lower metal resistance, placing a body contact on only one side of the RF switch layout, implementing metallization with reduced coupling from input to output, and/or providing air gaps to improve high frequency performance.

20 Claims, 23 Drawing Sheets

(56) References Cited

U.S. PATENT DOCUMENTS 5,313,083 A * 5/1994 Schindler ............. H03K 17/693
257/280
7,504,677 B2 * 3/2009 Glass ....................... H04B 1/48
257/268
8,432,016 B1 * 4/2013 Kerr ................... H10D 84/0151
257/206
9,054,027 B2 * 6/2015 Pendharkar .......... H10D 30/015
9,882,041 B1 * 1/2018 Joh ...................... H10D 30/015
10,326,018 B1 6/2019 Malladi
10,326,440 B1 * 6/2019 Malladi ................ H03K 17/223
10,593,800 B2 3/2020 Malladi
10,680,093 B2 * 6/2020 Joh ...................... H10D 30/015
10,734,516 B2 8/2020 Malladi
11,967,896 B2 * 4/2024 Blin ........................ H02M 3/07
12,027,461 B2 * 7/2024 Chen ..................... G06F 30/392
2008/0173907 A1 * 7/2008 Nakamoto ............. H10D 30/87
257/E29.264
2010/0096667 A1 * 4/2010 Nakajima ................ H04B 1/48
257/256
2010/0264995 A1 * 10/2010 Braithwaite ......... H03B 5/1203
330/277
2011/0156983 A1 * 6/2011 Ogawa ................. H10D 30/015
257/190
2012/0228632 A1 * 9/2012 Takada ............... H10D 30/4755
257/77
2013/0299878 A1 * 11/2013 Briere .................... H10D 30/47
257/288
2014/0103434 A1 * 4/2014 Lu .......................... H10D 30/60
716/120
2015/0041917 A1 * 2/2015 Zhu ...................... H10D 64/257
257/392
2015/0171898 A1 * 6/2015 Blin ................... H10D 30/6729
257/390
2016/0071811 A1 * 3/2016 Fuh ...................... H03K 17/693
257/532
2017/0250200 A1 * 8/2017 Lee .................... H10D 30/6711
2018/0130888 A1 * 5/2018 Bielunis ................. H10D 30/60
2018/0145679 A1 * 5/2018 Kim ....................... H01Q 1/248
2018/0190764 A1 * 7/2018 Wen ....................... H10D 30/65
2019/0319023 A1 * 10/2019 Ranta ................... H10D 64/257
2022/0013415 A1 * 1/2022 Blin ................. H03K 17/08104
2022/0044982 A1 * 2/2022 Mongin .................... H03F 1/30
2023/0068932 A1 * 3/2023 Nishiguchi .......... H10D 30/475
2023/0114964 A1 * 4/2023 Blin ........................ H02M 3/07
327/526
2023/0238385 A1 * 7/2023 Wang ................... H03K 17/102
257/347
2024/0039531 A1 2/2024 Blin
2024/0171137 A1 * 5/2024 Lim ...................... H03F 1/0288
2024/0223079 A1 * 7/2024 Blin ........................ H02M 3/07

* cited by examiner

MULTI-GATE RADIO FREQUENCY SWITCHES

CROSS-REFERENCE TO RELATED APPLICATIONS

This application claims the benefit of priority under 35 U.S.C. § 119 of U.S. Provisional Patent Application No. 63/369,435, filed Jul. 26, 2022 and titled "MULTI-GATE RADIO FREQUENCY SWITCHES," and of U.S. Provisional Patent Application No. 63/369,439, filed Jul. 26, 2022 and titled "APPARATUS AND METHODS FOR RADIO FREQUENCY SWITCHING," each of which is herein incorporated by reference in its entirety.

BACKGROUND

Technical Field

Embodiments of the invention relate to electronic systems, and in particular, to radio frequency (RF) electronics.

Description of Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a radio frequency switch. The radio frequency switch includes a first transistor gate structure including a first gate connection extending in parallel with a first edge of an active region and a first transistor gate extending from the first gate connection over the first edge of the active region. The radio frequency switch further includes a second transistor gate structure including a second gate connection extending in parallel with a second edge of the active region opposite the first edge and a second transistor gate extending from the second gate connection over the second edge of the active region. The radio frequency switch further includes a radio frequency switch input including a first source/drain connection extending in parallel to the first transistor gate and contacting the active region, and a radio frequency switch output including a second source/drain connection extending in parallel to the second transistor gate and contacting the active region. The first transistor gate and the second transistor gate are positioned between the first source/drain connection and the second source/drain connection.

In some embodiments, the first source/drain connection does not reach the second edge of the active region, and the second source/drain connection does not reach the first edge of the active region.

In various embodiments, the first gate connection, the first transistor gate, the second gate connection, and the second transistor gate are formed of polysilicon.

In several embodiments, the active region is rectangular.

In a number of embodiments, the active region includes a first rectangular region and a second rectangular region, the first rectangular region abutting but offset from the second rectangular region. According to various embodiments, the first transistor gate extends over the first rectangular region, and the second transistor gate extends over the second rectangular region.

In several embodiments, the radio frequency switch further includes an internal drain/source bias region extending in parallel to the second edge of the active region, the internal drain/source bias region contacting the active region between the first transistor gate and the second transistor gate.

In various embodiments, the active region is formed in a semiconductor, and the radio frequency switch further includes a body contact region that contacts the semiconductor adjacent to the first edge of the active region. According to a number of embodiments, the body contact region includes a plurality of body contacts bridged by metal. In accordance with several embodiments, a body contact is present only on one side of the active region.

In certain embodiments, the present disclosure relates to a mobile device. The mobile device includes an antenna, and a front-end system coupled to the antenna and including a radio frequency switch. The radio frequency switch includes a first transistor gate structure that includes a first gate connection extending in parallel with a first edge of an active region and a first transistor gate extending from the first gate connection over the first edge of the active region. The radio frequency switch further incudes a second transistor gate structure that includes a second gate connection extending in parallel with a second edge of the active region opposite the first edge and a second transistor gate extending from the second gate connection over the second edge of the active region. The radio frequency switch further includes a radio frequency switch input that includes a first source/drain connection extending in parallel to the first transistor gate and contacting the active region, and a radio frequency switch output that includes a second source/drain connection extending in parallel to the second transistor gate and contacting the active region. The first transistor gate and the second transistor gate are positioned between the first source/drain connection and the second source/drain connection.

In various embodiments, the front-end system further includes a power amplifier having an output connected to the radio frequency switch input.

In several embodiments, the front-end system further includes a low noise amplifier having an input connected to the radio frequency switch output.

In certain embodiments, the present disclosure relates to a packaged module. The packaged module includes a package substrate and a semiconductor die attached to the package substrate and including a radio frequency switch formed thereon. The radio frequency switch includes a first transistor gate structure that includes a first gate connection extending in parallel with a first edge of an active region and a first transistor gate extending from the first gate connection over the first edge of the active region. The radio frequency switch further includes a second transistor gate structure that includes a second gate connection extending in parallel with a second edge of the active region opposite the first edge and a second transistor gate extending from the second gate connection over the second edge of the active region. The radio frequency switch further includes a radio frequency switch input that includes a first source/drain connection extending in parallel to the first transistor gate and contacting the active region, and a radio frequency switch output that includes a second source/drain connection extending in parallel to the second transistor gate and contacting the active region. The first transistor gate and the second transistor gate are positioned between the first source/drain connection and the second source/drain connection.

In some embodiments, the first source/drain connection does not reach the second edge of the active region, and the second source/drain connection does not reach the first edge of the active region.

In several embodiments, the first gate connection, the first transistor gate, the second gate connection, and the second transistor gate are formed of polysilicon.

In some embodiments, the active region is rectangular.

In various embodiments, the active region includes a first rectangular region and a second rectangular region, the first rectangular region abutting but offset from the second rectangular region. According to a number of embodiments, the first transistor gate extends over the first rectangular region, and the second transistor gate extends over the second rectangular region. In accordance with several embodiments, the packaged module further includes an internal drain/source bias region extending in parallel to the second edge of the active region, the internal drain/source bias region contacting the active region between the first transistor gate and the second transistor gate.

In some embodiments, the semiconductor die includes a semiconductor region in which the active region is formed, and the radio frequency switch further includes a body contact region that contacts the semiconductor adjacent to the first edge of the active region.

In several embodiments, the body contact region includes a plurality of body contacts bridged by metal.

In various embodiments, a body contact is present only on one side of the active region.

In certain embodiments, a radio frequency switch is disclosed. The radio frequency switch includes a first field-effect transistor including a first source, a first drain, and a first transistor gate extending over a first edge of an active region. The radio frequency switch further includes a second field-effect transistor having a second source connected to the first drain, a second drain, and a second transistor gate extending over a second edge of the active region opposite the first edge. The radio frequency switch further includes a radio frequency switch input connection extending in parallel to the first transistor gate and contacting the active region to connect to the first source of the first field-effect transistor. The radio frequency switch further includes a radio frequency switch output connection extending in parallel to the second transistor gate and contacting the active region to connect to the second drain of the second field-effect transistor. The first transistor gate and the second transistor gate are positioned between the radio frequency switch input connection and the radio frequency switch output connection.

In various embodiments, the radio frequency switch input connection does not reach the second edge of the active region, and the radio frequency switch output connection does not reach the first edge of the active region.

In several embodiments, the active region is rectangular.

In some embodiments, the active region includes a first rectangular region and a second rectangular region, the first rectangular region abutting but offset from the second rectangular region. According to a number of embodiments, the first transistor gate extends over the first rectangular region, and the second transistor gate extends over the second rectangular region.

In several embodiments, the radio frequency switch further includes an internal drain/source bias region extending in parallel to the second edge of the active region, the internal drain/source bias region contacting the active region to connect to the drain of the first field-effect transistor and to the source of the second field-effect transistor.

In various embodiments, the active region is formed in a semiconductor, and the radio frequency switch further includes a body contact region that contacts the semiconductor adjacent to the first edge of the active region.

In some embodiments, the body contact region includes a plurality of body contacts bridged by metal. According to several embodiments, a body contact is present only on one side of the active region.

In certain embodiments, the present disclosure relates to a mobile device. The mobile device includes an antenna, and a front-end system coupled to the antenna and including a radio frequency switch. The radio frequency switch includes a first field-effect transistor that includes a first source, a first drain, and a first transistor gate extending over a first edge of an active region. The radio frequency switch further includes a second field-effect transistor that includes a second source connected to the first drain, a second drain, and a second transistor gate extending over a second edge of the active region opposite the first edge. The radio frequency switch further includes a radio frequency switch input connection extending in parallel to the first transistor gate and contacting the active region to connect to the first source of the first field-effect transistor. The radio frequency switch further includes a radio frequency switch output connection extending in parallel to the second transistor gate and contacting the active region to connect to the second drain of the second field-effect transistor. The first transistor gate and the second transistor gate are positioned between the radio frequency switch input connection and the radio frequency switch output connection.

In various embodiments, the front-end system further includes a power amplifier having an output connected to the radio frequency switch input.

In several embodiments, the front-end system further includes a low noise amplifier having an input connected to the radio frequency switch output.

In certain embodiments, the present disclosure relates to a packaged module. The packaged module includes a package substrate, and a semiconductor die attached to the package substrate and including a radio frequency switch formed thereon. The radio frequency switch includes a first field-effect transistor that includes a first source, a first drain, and a first transistor gate extending over a first edge of an active region. The radio frequency switch further includes a second field-effect transistor that includes a second source connected to the first drain, a second drain, and a second transistor gate extending over a second edge of the active region opposite the first edge. The radio frequency switch further includes a radio frequency switch input connection extending in parallel to the first transistor gate and contacting the active region to connect to the first source of the first field-effect transistor. The radio frequency switch further includes a radio frequency switch output connection extending in parallel to the second transistor gate and contacting the active region to connect to the second drain of the second field-effect transistor. The first transistor gate and the second transistor gate are positioned between the radio frequency switch input connection and the radio frequency switch output connection.

In various embodiments, the radio frequency switch input connection does not reach the second edge of the active region, and the radio frequency switch output connection does not reach the first edge of the active region.

In several embodiments, the active region is rectangular.

In some embodiments, the active region includes a first rectangular region and a second rectangular region, the first rectangular region abutting but offset from the second rectangular region. According to a number of embodiments, the first transistor gate extends over the first rectangular region, and the second transistor gate extends over the second rectangular region.

In various embodiments, the packaged module further includes an internal drain/source bias region extending in parallel to the second edge of the active region, the internal drain/source bias region contacting the active region to connect to the drain of the first field-effect transistor and to the source of the second field-effect transistor.

In several embodiments, the active region is formed in a semiconductor, and the radio frequency switch further includes a body contact region that contacts the semiconductor adjacent to the first edge of the active region.

In some embodiments, the body contact region includes a plurality of body contacts bridged by metal. According to a number of embodiments, a body contact is present only on one side of the active region.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
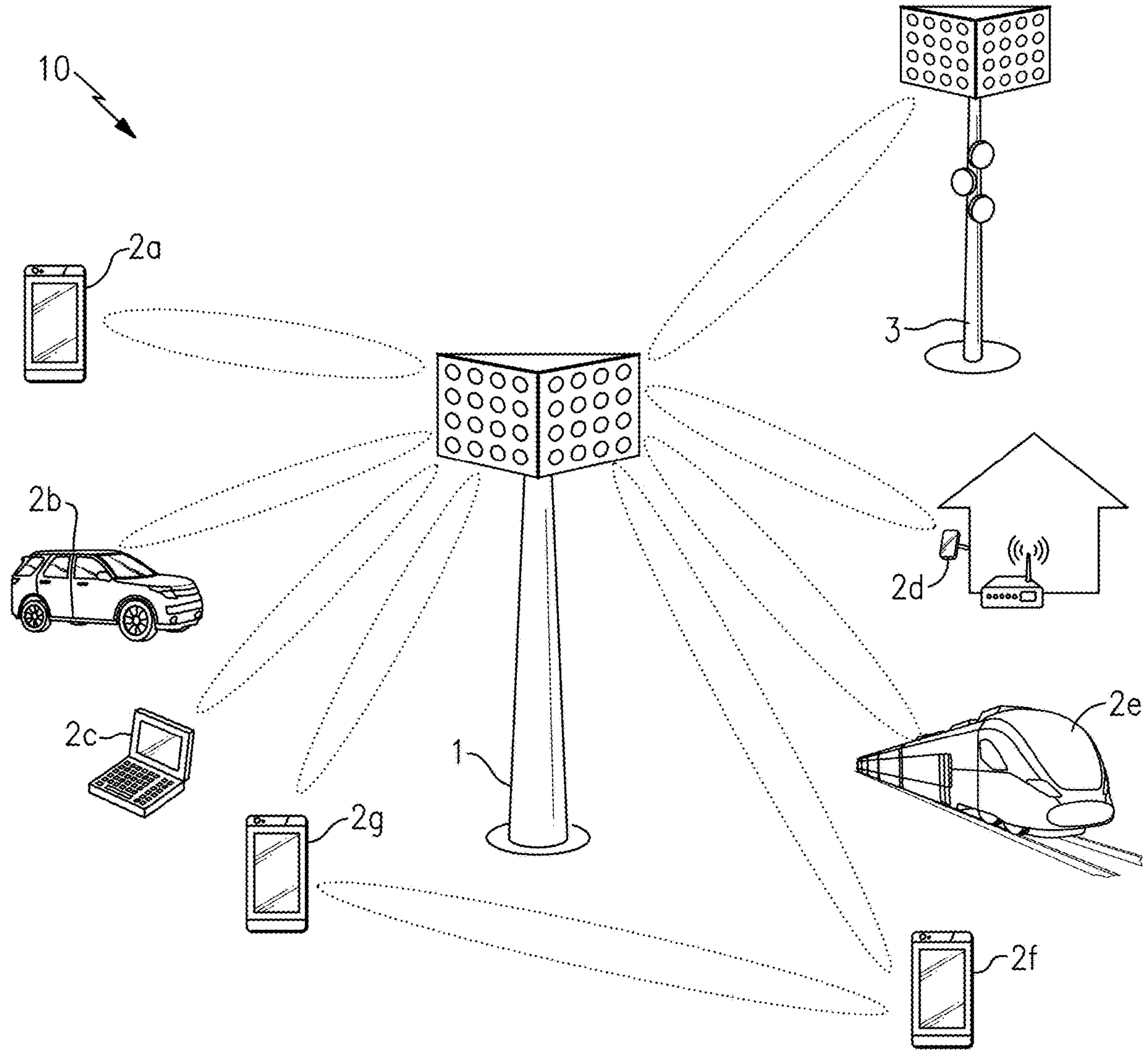
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2*a*, a wireless-connected car 2*b*, a laptop 2*c*, a stationary wireless device 2*d*, a wireless-connected train 2*e*, a second mobile device 2*f*, and a third mobile device 2*g*.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2*g* and mobile device 2*f*).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
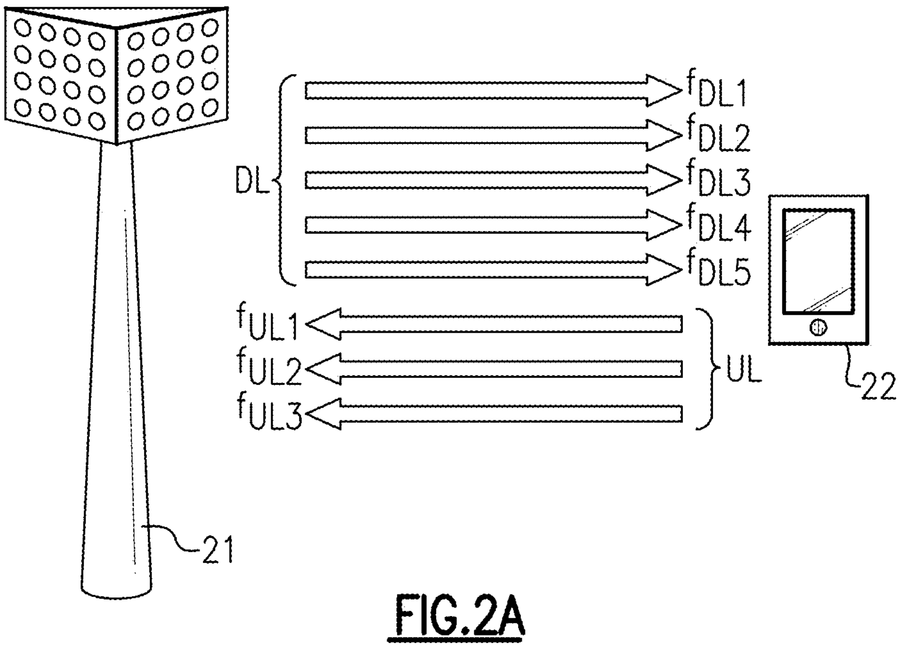
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
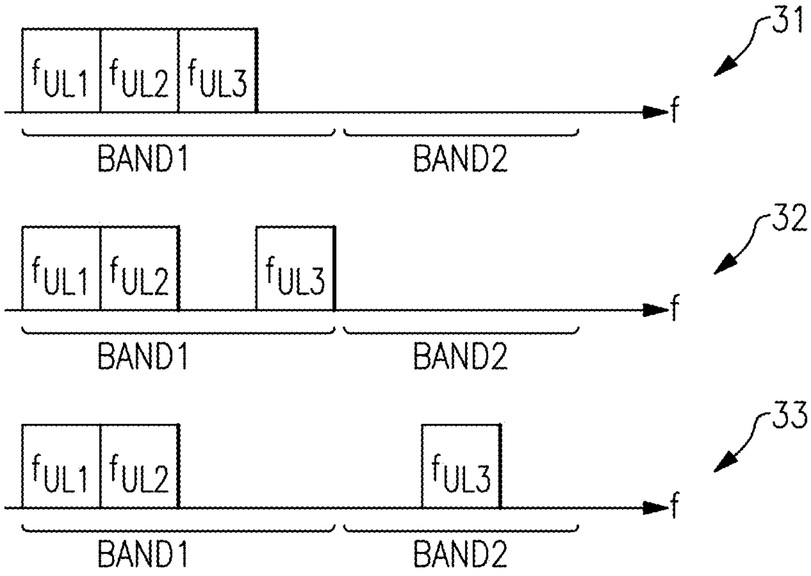
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
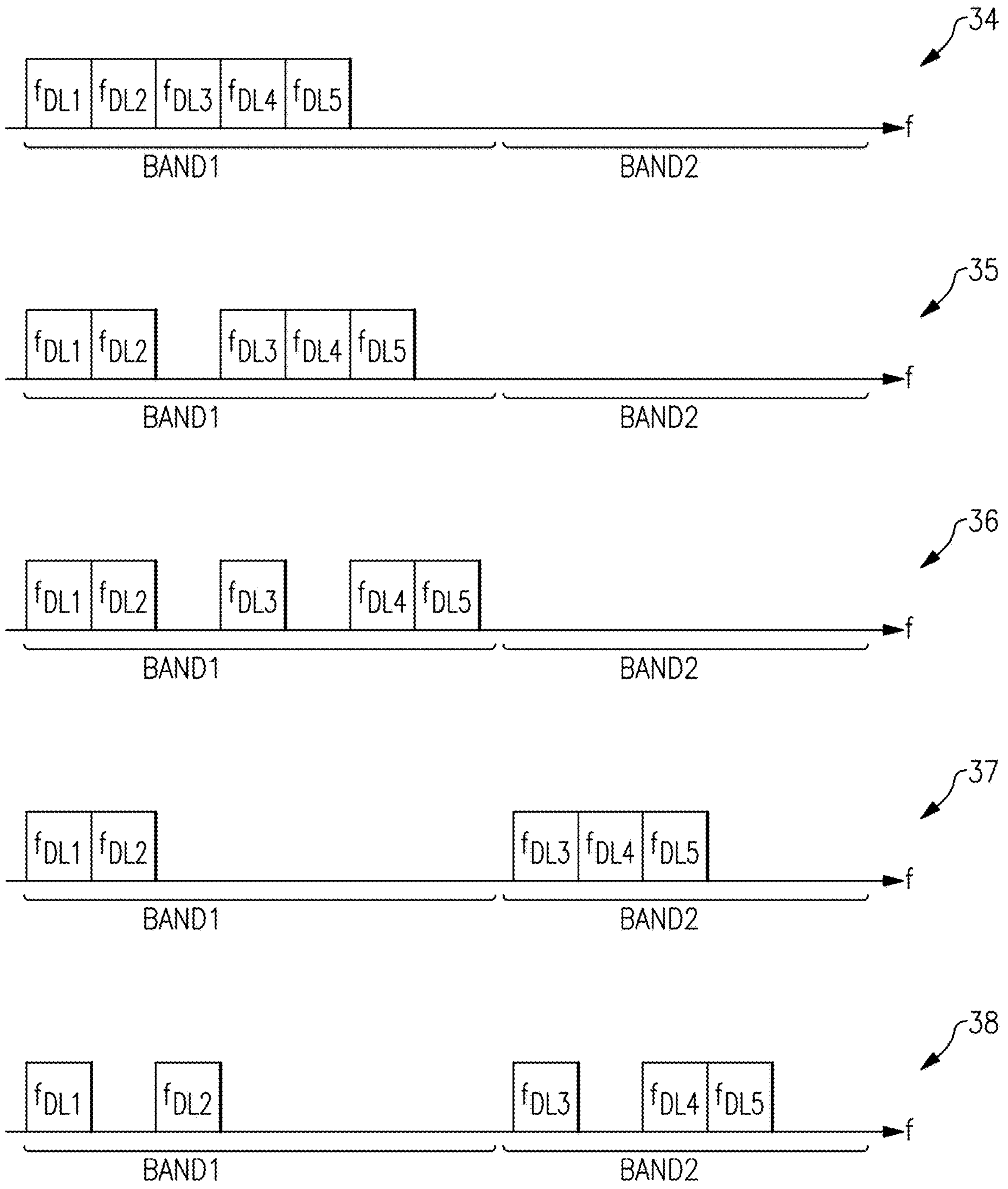
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
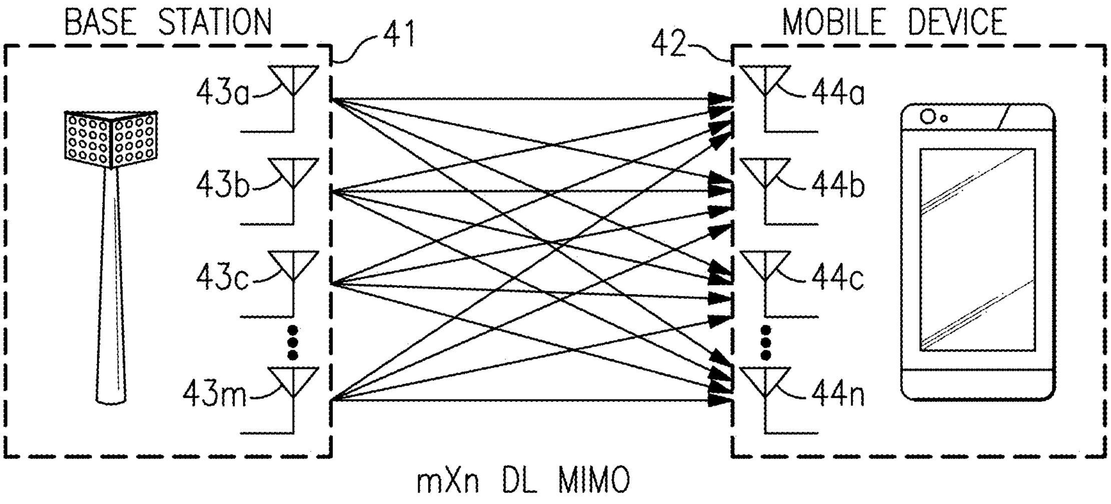
FIG. 3A is a schematic diagram of one example of a downlink channel using multi-input and multi-output (MIMO) communications.
Figure 3B:
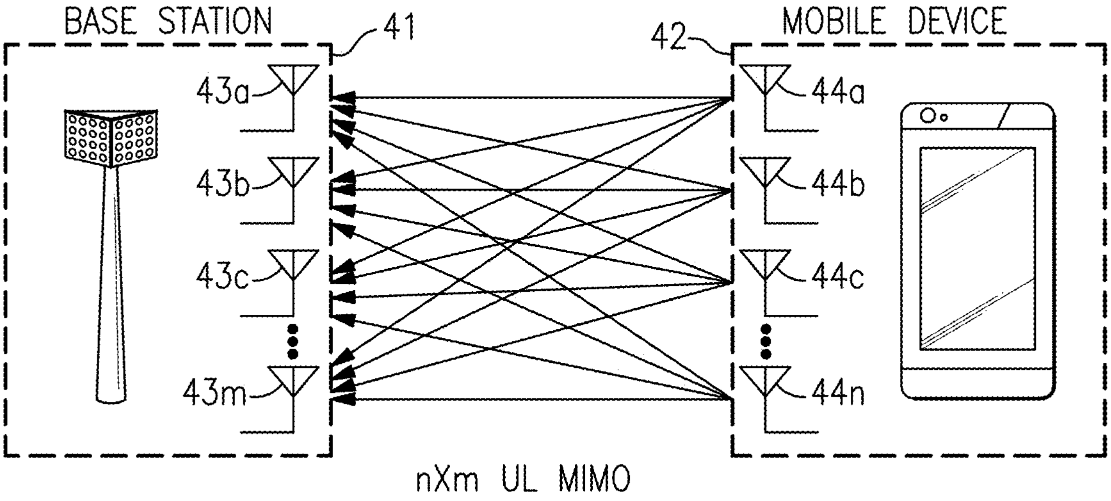
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43*a*, 43*b*, 43*c*, . . . 43*m* of the base station 41 and receiving using N antennas 44*a*, 44*b*, 44*c*, . . . 44*n* of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44*a*, 44*b*, 44*c*, . . . 44*n* of the mobile device 42 and receiving using M antennas 43*a*, 43*b*, 43*c*, . . . 43*m* of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
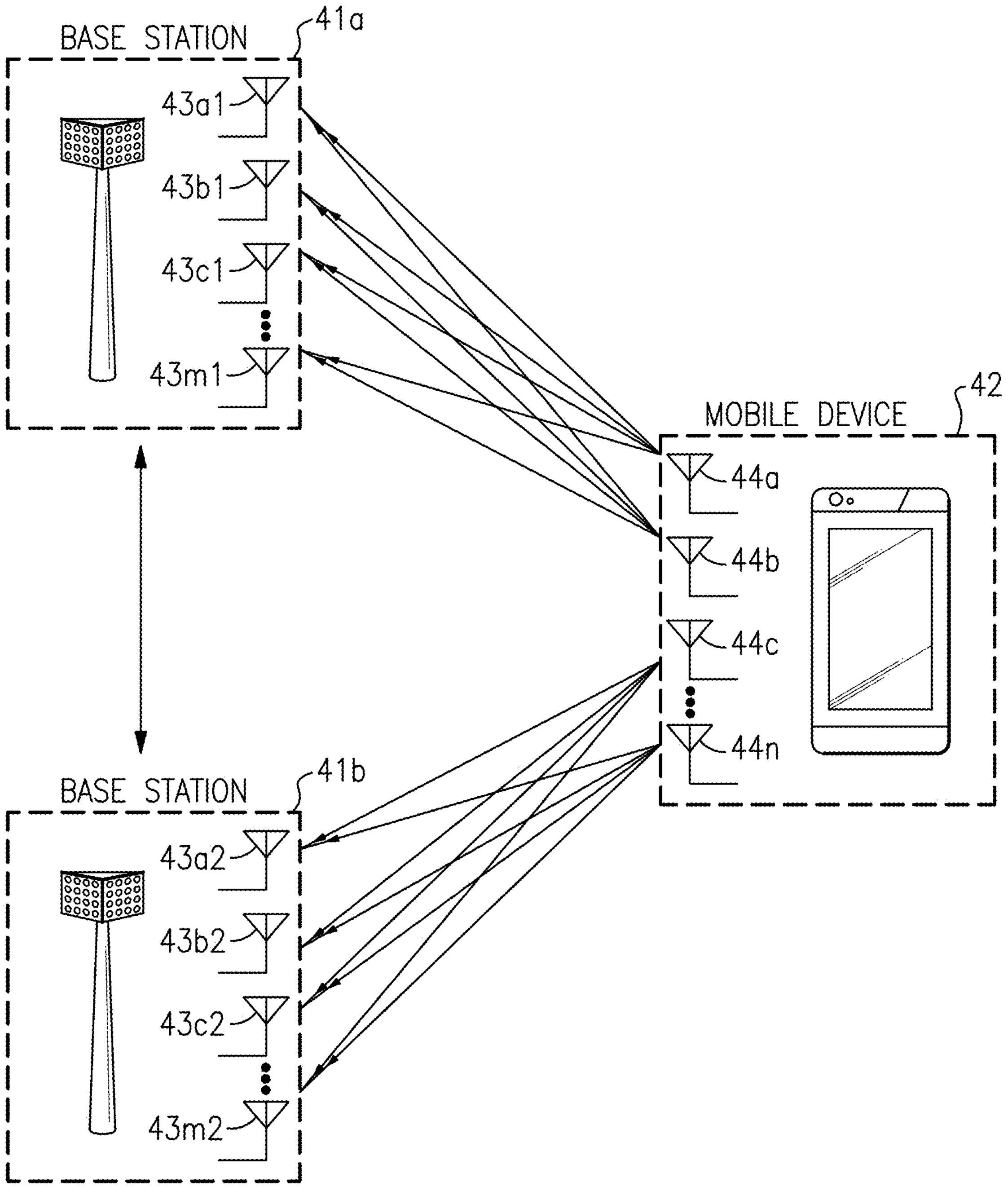
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44*a*, 44*b*, 44*c*, . . . 44*n* of the mobile device 42. Additional a first portion of the uplink transmissions are received using M antennas 43*a*1, 43*b*1, 43*c*1, . . . 43*m*1 of a first base station 41*a*, while a second portion of the uplink transmissions are received using M antennas 43*a*2, 43*b*2, 43*c*2, . . . 43*m*2 of a second base station 41*b*. Additionally, the first base station 41*a* and the second base station 41*b* communication with one another over wired, optical, and/or wireless links.

The MIMO scenario of FIG. 3C illustrates an example in which multiple base stations cooperate to facilitate MIMO communications.

Figure 4A:
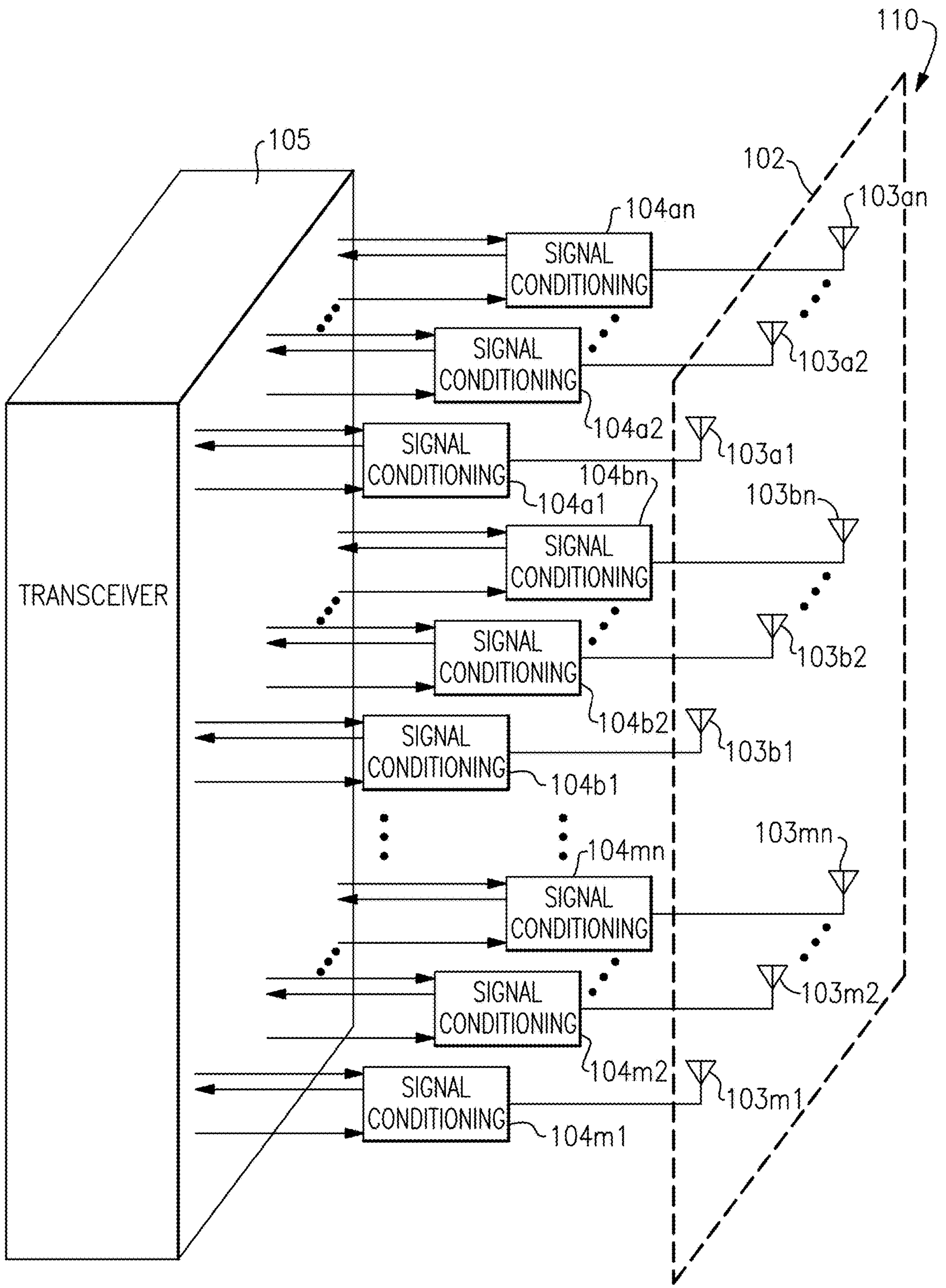
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104*a*1, 104*a*2 . . . 104*an*, 104*b*1, 104*b*2 . . . 104*bn*, 104*m*1, 104*m*2 . . . 104*mn*, and an antenna array 102 that includes antenna elements 103*a*1, 103*a*2 . . . 103*an*, 103*b*1, 103*b*2 . . . 103*bn*, 103*m*1, 103*m*2 . . . 103*mn*.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal propagates for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
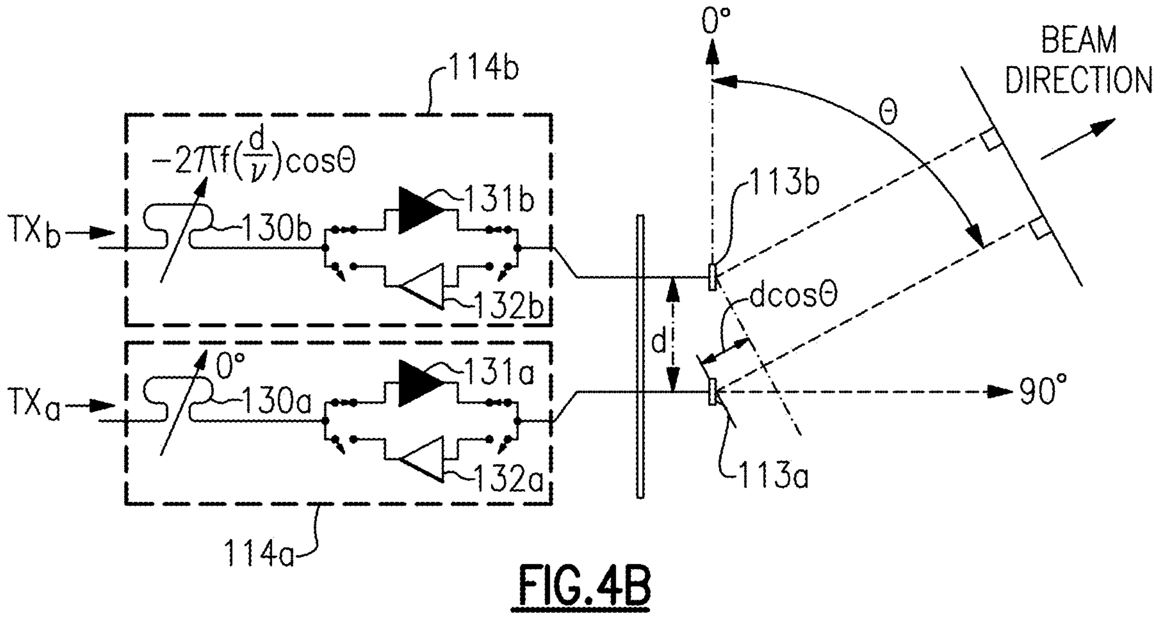
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114*a*, a second signal conditioning circuit 114*b*, a first antenna element 113*a*, and a second antenna element 113*b*.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114*a* includes a first phase shifter 130*a*, a first power amplifier 131*a*, a first low noise amplifier (LNA) 132*a*, and switches for controlling selection of the power amplifier 131*a* or LNA 132*a*. Additionally, the second signal conditioning circuit 114*b* includes a second phase shifter 130*b*, a second power amplifier 131*b*, a second LNA 132*b*, and switches for controlling selection of the power amplifier 131*b* or LNA 132*b*.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113*a* and the second antenna element 113*b* are separated by a distance d. Additionally, FIG. 4B has been annotated with an angle Θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113*a*, 113*b*, a desired transmit beam angle Θ can be achieved. For example, when the first phase shifter 130*a* has a reference value of 0°, the second phase shifter 130*b* can be controlled to provide a phase shift of about $-2\pi f(d/v)\cos\Theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130*b* can be controlled to provide a phase shift of about $-\pi\cos\Theta$ radians to achieve a transmit beam angle Θ.

Accordingly, the relative phase of the phase shifters 130*a*, 130*b* can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
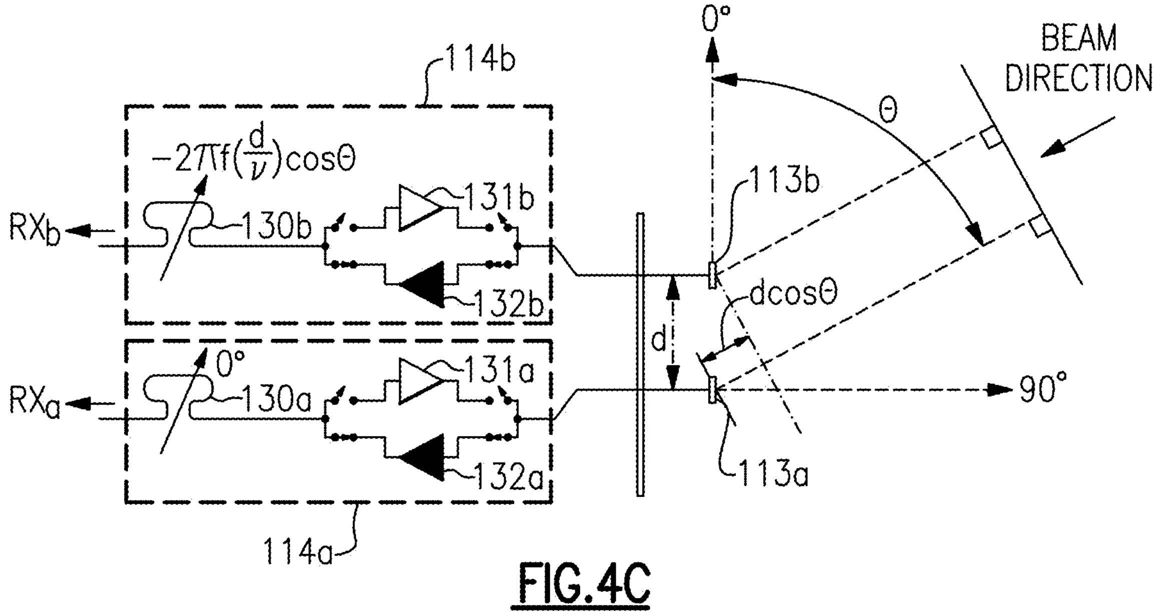
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130*a* and the second phase shifter 130*b* can be selected to about equal to $-2\pi f(d/v)\cos\Theta$ radians to achieve a desired receive beam angle Θ. In implementations in which the distance d corresponds to about ½λ), the phase difference can be selected to about equal to $-\pi\cos\Theta$ radians to achieve a receive beam angle Θ.

Although various equations for phase values to provide beamforming have been provided, other phase selection values are possible, such as phase values selected based on implementation of an antenna array, implementation of signal conditioning circuits, and/or a radio environment.

Examples of RF Switches

An overall performance of an RF communication system can be impacted by the performance of RF switches along signal paths of the RF communication system.

One key figure of merit (FOM) of an RF switch is a product of the on-state resistance (Ron) and off-state capacitance (Coff) of the RF switch. As operating frequencies increase (for example, to frequencies of 20 GHz or more, such as 5G FR2 and/or millimeter wave frequencies), inductive and/or skin effects arising from a layout of the RF switch leads to a degradation in FOM.

A multi-gate layout can be used to reduce resistance contributions by removing a portion of the metal routing and its associated resistance, inductance, and/or current crowding effects.

However, conventional multi-gate RF switches suffer from a number of undesirable properties including, for example, direct input to output metal parasitics (for instance, coupling from an input metal bus to an output metal bus), long metal fingers that handle large currents, additional coupling from internal drain-to-source routing, and/or no body bias (only floating body design). Such undesirable properties degrade FOM.

Apparatus and methods for multi-gate RF switches are disclosed herein. The RF switches used a number of layout design techniques to improve FOM. For example, the RF switches can be implemented with various features to lower Ron and/or decrease Coff, thereby leading to an improvement in FOM.

In certain implementations, an RF switch layout includes only two FETs in series (two gates placed over a diffusion region between source and drain contacts) to maintain shorter fingers for lower drain/source metal resistance. Additionally, using only two gates avoids direct input/output coupling otherwise present for a stack of 4 or more gates. Such RF switch layouts of two gates can be stacked to form a composite RF switch including more than two gates. Thus, an RF switch with a desired number of gates can be achieved to realize a desired power handling capability.

The RF switch layouts herein can be implemented with a body bias. For example, a T-body style can be used to access the body of each FET. Although a floating body layout remains possible and can be more compact.

In certain implementations, the body contact is placed on only one side of the RF switch layout (for a first gate/first FET) with a second gate/second FET on the other side omitting a body contact. By implementing the RF switch layout in this manner, gate routing through polysilicon (poly) can be achieved. Accordingly, FET to FET routing (in the stack) is enabled, which allows a lowest metal layer (a first metal layer or metal one placed closest to active silicon) to be used for lower overall Ron. Furthermore, such benefits are achieved while allowing for body bias.

The direct coupling from input to output can be reduced by making the drain/source fingers shorter and removing the tip (removing, for instance, or more contacts to the active region and associated metal). Thus, in certain implementations, metal is omitted at the end of a drain and/or source finger in favor of using silicide to distribute the current to the end of the finger. Additionally or alternatively, input/output metal bars can be spaced away from output/input drain/source fingers.

In certain implementations, internal drain/source DC bias (between two gates) is achieved by relying on active silicide. Such active silicide can use a meandering route (or snake routing) to avoid interruption of main input/output metal drain/source routing layers (for example, on metal one or in other implementations, on metal one and metal two). By biasing the internal node, floating body effects such as slow settling times and/or history effects are avoided.

The RF switch layouts herein can also push out the source/drain contact resistance away from the gate to reduce the drain/source metal coupling capacitance and leveraging the low resistance of the drain/source silicide. Such a technique can be applied to both side of the gates or only on the side a metal connection is present. For example, by applying this technique to only the metal routing side, a better tradeoff between area and Coff tradeoff may be achieved for some applications.

In certain implementations, air gap trenches between contacts and metal one are used to reduce coupling from metal one to metal one, from contact to contact, and/or from metal one to contact. Thus, air-gap trenches between bias resistors can be used to improve performance at higher frequencies, such as FR2 frequencies.

Figure 5A:
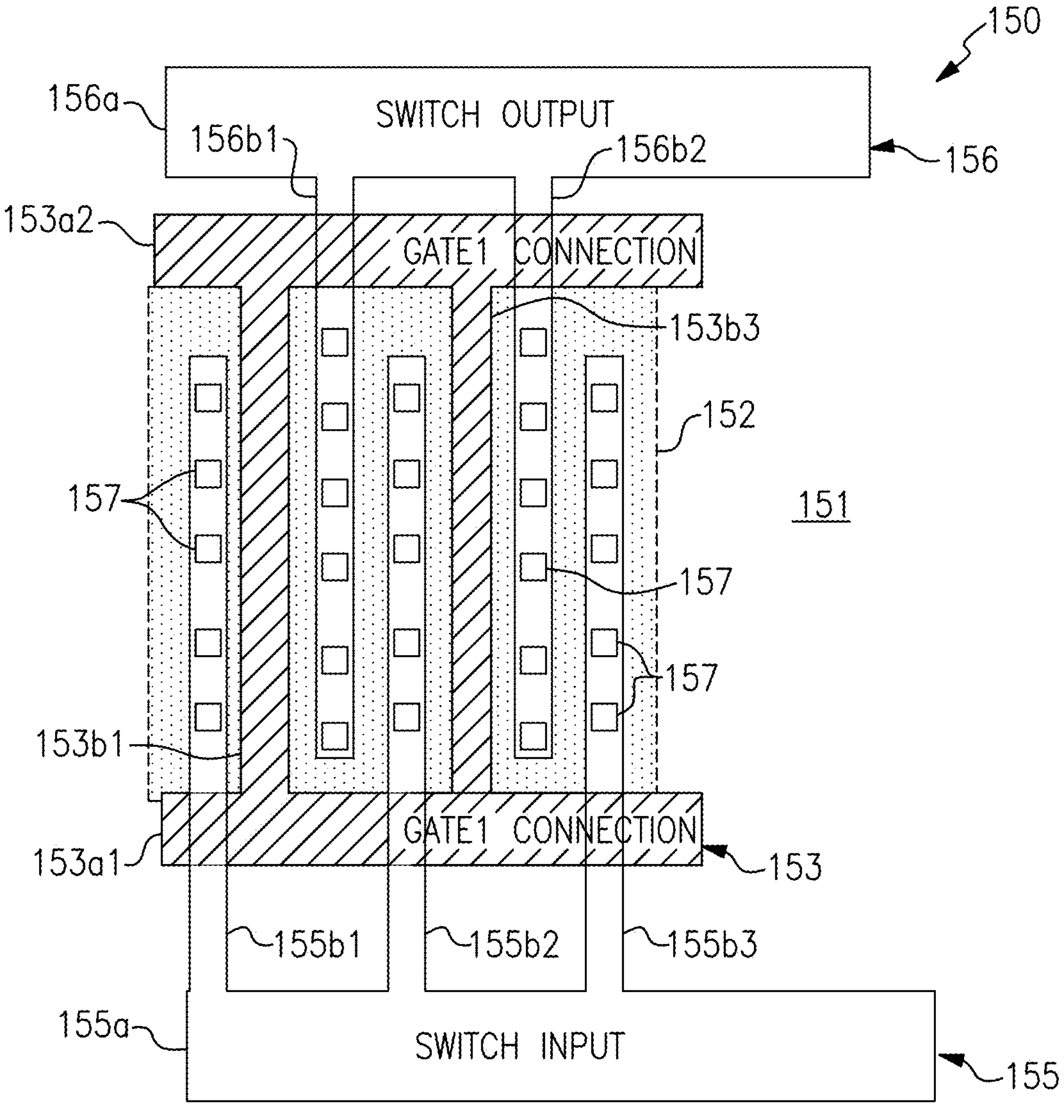
FIG. 5A is a schematic diagram of one embodiment of a layout for a radio frequency (RF) switch.

FIG. 5A is a schematic diagram of one embodiment of a layout 150 for an RF switch. The layout 150 is formed in a semiconductor substrate 151, which can have any suitable doping. The layout 150 represents an overhead or plan view of a cell for an RF switch. The layout 150 includes an active region 152, a gate structure or gate 153, a switch input 155, a switch output 156, and contacts 157 for providing a connection from metal regions to the active region 152.

The active region 152 is rectangular, in this embodiment. Additionally, the gate structure 153 includes a first horizontal gate region **153*a*1 along a bottom edge of the active region 152 and a second horizontal gate region 153*a*2 along a top edge of the active region 152. Additionally, the gate structure 153 includes a first vertical gate region 153*b*1 and a second vertical gate region 153*b*2 connecting the first horizontal gate region 153*a*1 to the second horizontal gate region 153*a*2**.

As used herein, the terms horizontal and vertical serve to denote a pair of orthogonal directions (for instance, x and y) relative to any reference point.

With continuing reference to FIG. 5A, the switch input 155 includes a horizontal metal region **155*a*, a first vertical metal region 155*b*1, a second vertical metal region 155*b*2, and a third vertical metal region 155*b*3. The vertical metal regions 155*b*1-155*b*3 extend upwardly from the horizontal metal region 155*a* over the bottom edge of the active region 152 but do not reach the top edge of the active region 152. Contacts 157 are included along each of the vertical metal regions 155*b*1-155*b*3 to contact the switch's source/drain regions. Thus, the contacts 157 serve as an electrical connection between the vertical metal regions and the active region 152**.

The switch output 156 includes a horizontal metal region **156*a*, a first vertical metal region 156*b*1, and a second vertical metal region 156*b*2. The vertical metal regions 156*b*1-156*b*2 extend downwardly from the horizontal metal region 155*a* over the top edge of the active region 152 but do not reach the bottom edge of the active region 152. Contacts 157 are included along each of the vertical metal regions 155*b*1-155*b*2** to contact the switch's source/drain regions.

Figure 5B:
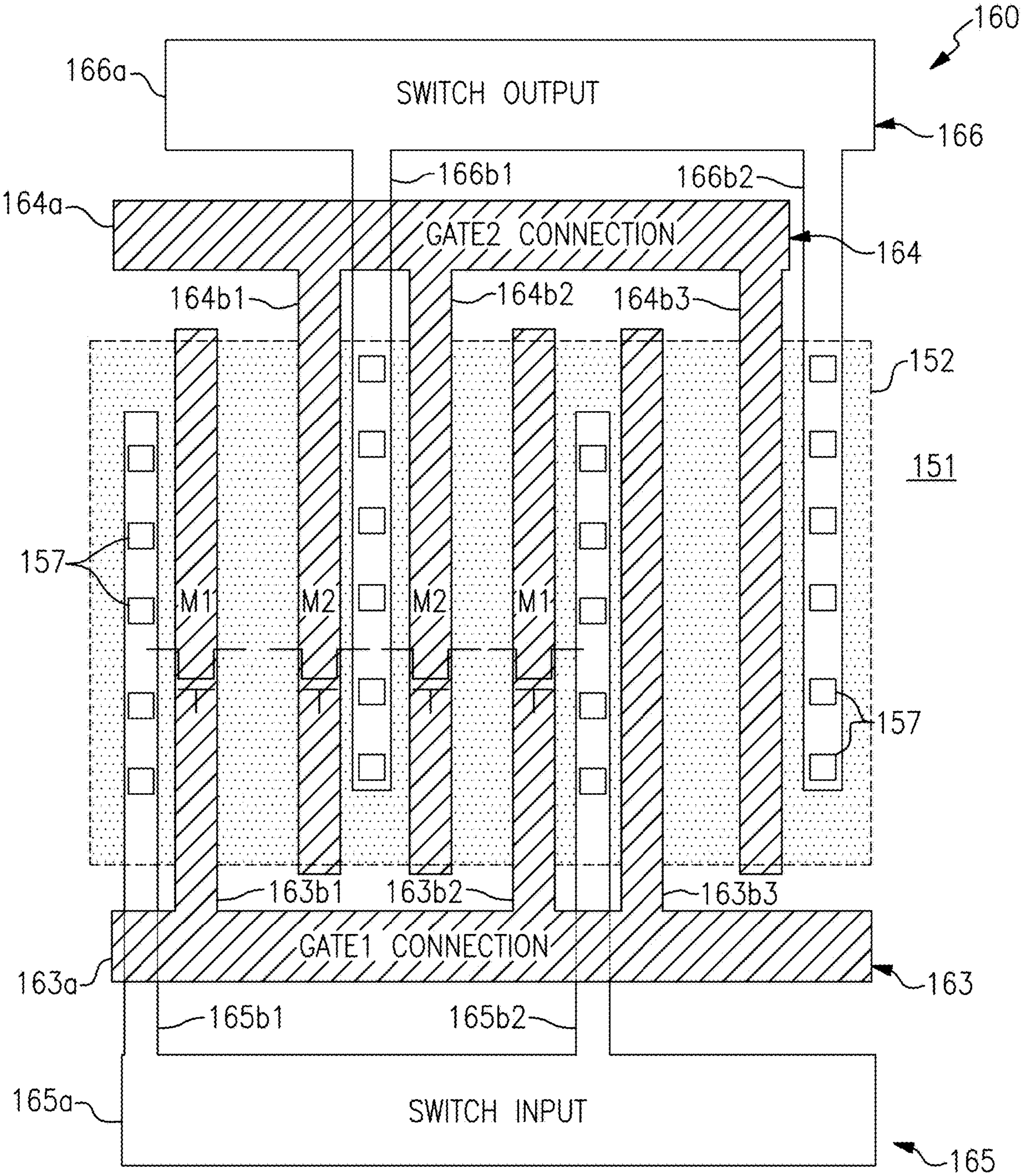
FIG. 5B is a schematic diagram of another embodiment of a layout for an RF switch.

FIG. 5B is a schematic diagram of another embodiment of a layout 160 for an RF switch. The layout 160 includes an active region 152, a first gate structure 163, a second gate structure 164, a switch input 165, a switch output 166, and contacts 157 for providing a connection from metal regions to the active region 152.

The first gate structure 163 includes a horizontal gate region **163*a* below a bottom edge of the active region 152. Additionally, the first gate structure 163 includes a first vertical gate region 163*b*1, a second vertical gate region 163*b*2, and a third vertical gate region 163*b*3 extending upward from the horizontal gate region 163*a* to a top edge of the active region 152**.

With continuing reference to FIG. 5B, the second gate structure 164 includes a horizontal gate region 164 above the top edge of the active region 152. Additionally, the second gate structure 164 includes a first vertical gate region **143*b*1, a second vertical gate region 164*b*2, and a third vertical gate region 164*b*3 extending downward from the horizontal gate region 164*a* to the bottom edge of the active region 152**.

The switch input 165 includes a horizontal metal region **165*a*, a first vertical metal region 165*b*1, and a second vertical metal region 165*b*2. The vertical metal regions 165*b*1-165*b*2 extend upwardly from the horizontal metal region 165*a* over the bottom edge of the active region 152 but do not reach the top edge of the active region 152. Contacts 157 are included along each of the vertical metal regions 165*b*1-165*b*2** to contact the switch's source/drain regions.

The switch output 166 includes a horizontal metal region **166*a*, a first vertical metal region 166*b*1, and a second vertical metal region 166*b*2. The vertical metal regions 166*b*1-166*b*2 extend downwardly from the horizontal metal region 166*a* over the top edge of the active region 152 but do not reach the bottom edge of the active region 152. Contacts 157 are included along each of the vertical metal regions 166*b*1-166*b*2** to contact the switch's source/drain regions.

A first field-effect transistor (FET) M1 and a second FET M2 are depicted in FIG. 5B. The first FET M1 and the second FET M2 are in series between the switch input 165 and the switch output 166. Each vertical region of the first gate structure 163 forms a finger of the first FET M1, while each vertical region of the second gate structure 164 forms a finger of the second FET M2.

The horizontal gate region **163*a* is made of polysilicon, and is used to provide connections between the vertical gate regions 163*b*1-163*b*3 that form the gate of M1. Thus, gate fingers are connected by polysilicon rather than metal. Likewise, horizontal gate region 164*a* is made of polysilicon, and is used to provide connections between the vertical gate regions 164*b*1-164*b*3 that form the gate of M2**.

The input and output of the dual-gate switch can use the lowest routing layer (metal one) throughout for better Ron. For example, implementing the switch in this manner avoids a need for an RF signal to propagate through resistive vias connecting metal layers. However, more metal can be stacked on top of the depicted metal one regions to further reduce Ron.

As shown in FIG. 5B, no contacts 157 are included between the vertical gate region **163*b*1 of the first gate structure 163 and the vertical gate region 164*b*1 of the second gate structure 164. Thus, an inner drain/source region between M1 and M2** does not include contacts. Removing this metal reduces total parasitic capacitance.

Figure 5C:
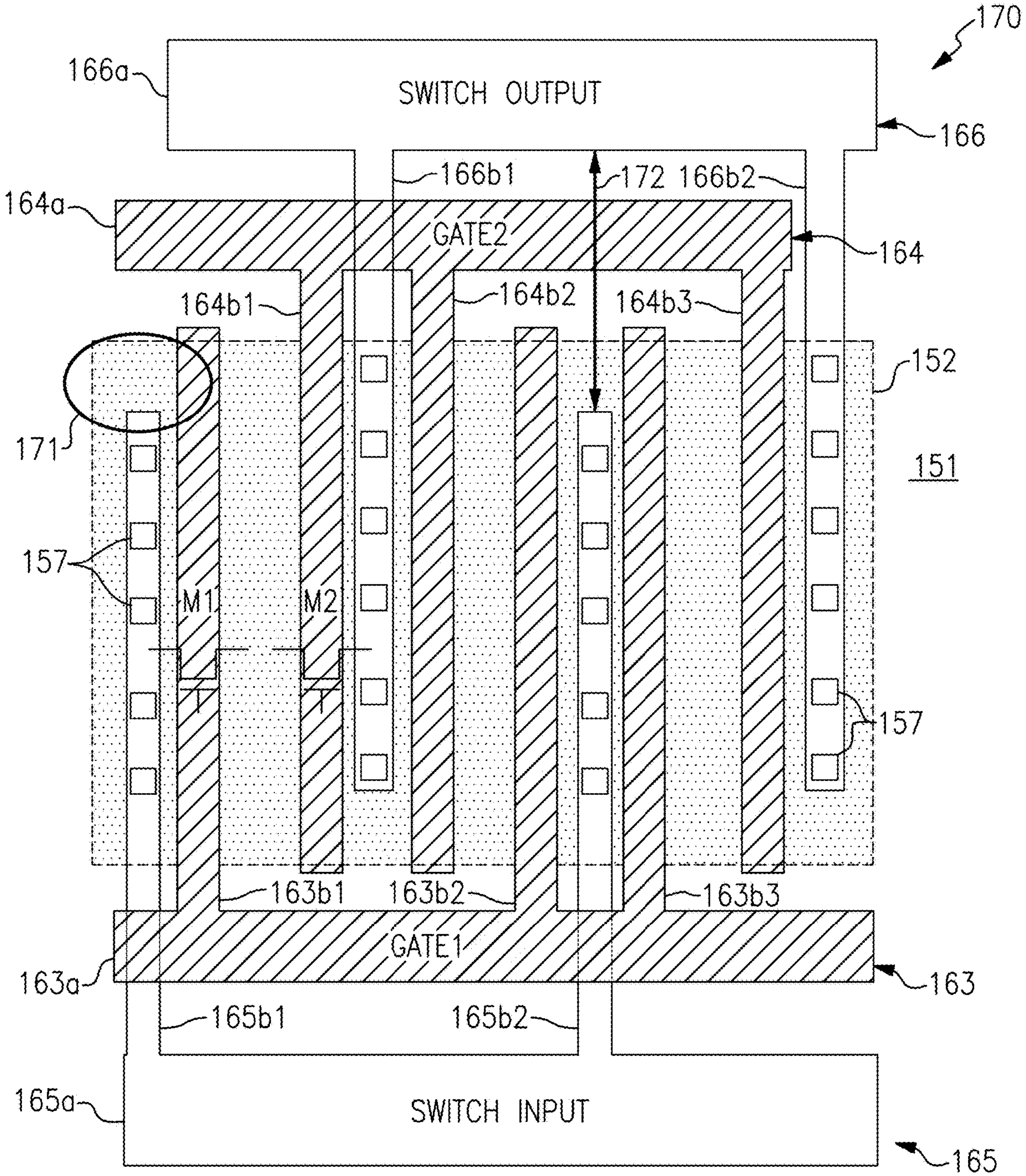
FIG. 5C is a schematic diagram of another embodiment of a layout for an RF switch.

FIG. 5C is a schematic diagram of another embodiment of a layout 170 for an RF switch. The layout 170 includes an active region 152, a first gate structure 163, a second gate structure 164, a switch input 165, a switch output 166, and contacts 157 for providing a connection from metal regions to the active region 152.

The layout 170 of FIG. 5C is similar to the layout 160 of FIG. 5B. However, the layout 170 of FIG. 5C is annotated to show a separation 171 between a tip of the vertical metal region **165*b*1 of the switch input 165 and the top edge of the active region 152, and to a metal-to-metal spacing 172 between a tip of the vertical metal region 165*b*2 of the switch input 165 and the horizontal metal region 166*a* of the switch output 166**.

By implementing the layout 170 in this manner, a low amount of parasitic capacitance between the switch input 165 and the switch output 166 is provided.

Accordingly, in certain implementations herein, a tip of a drain/source finger is cut relative to an edge of an active region. Additionally or alternatively, an increased distance between the drain/source metal finger tips and the input/output metal bar is provided. Thus, the current is carried from the contacts to the FET channel through the source/drain silicide.

Figure 5D:
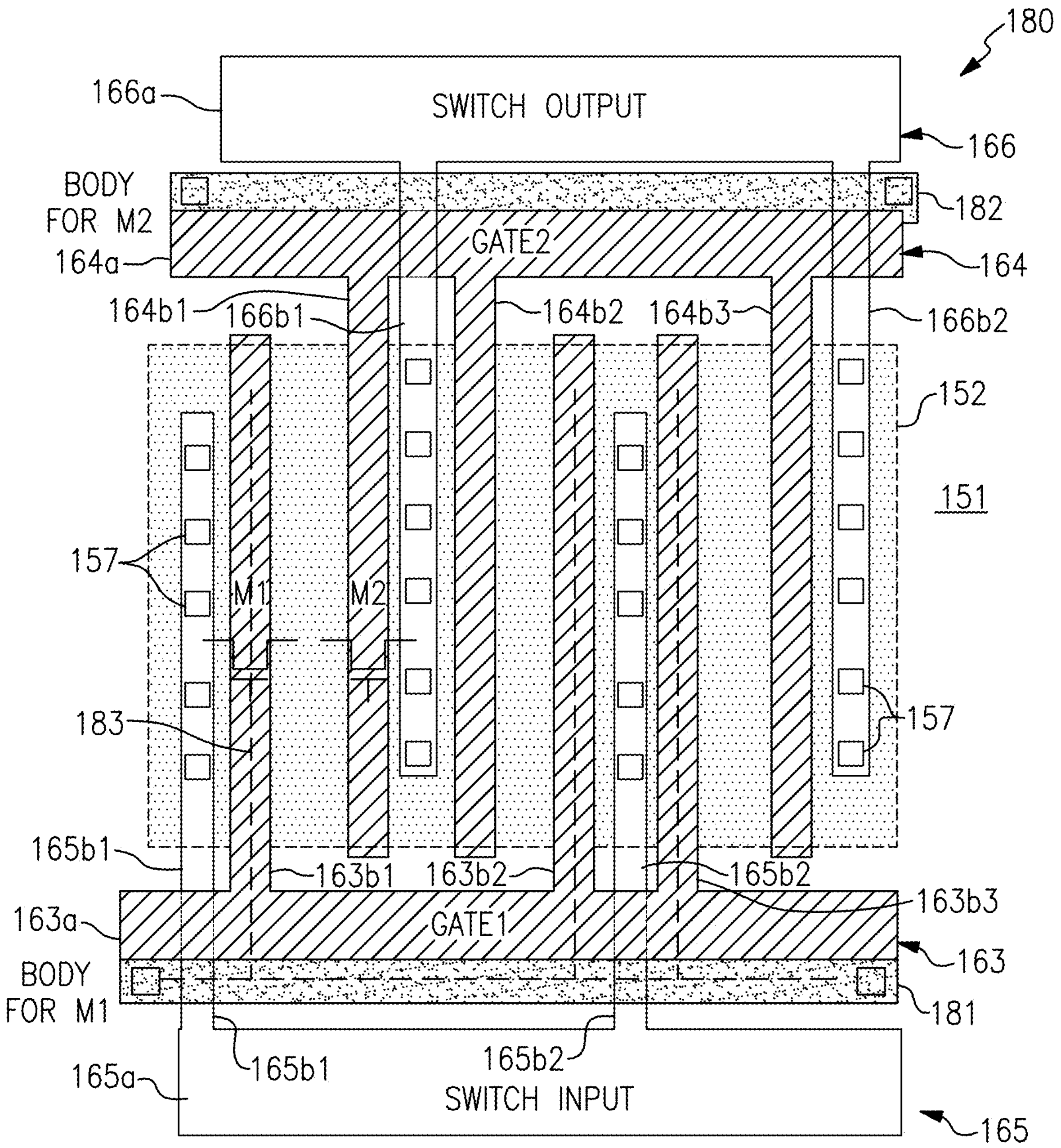
FIG. 5D is a schematic diagram of another embodiment of a layout for an RF switch.

FIG. 5D is a schematic diagram of another embodiment of a layout 180 for an RF switch. The layout 180 includes an active region 152, a first gate structure 163, a second gate structure 164, a switch input 165, a switch output 166, contacts 157, a first body bias region 181, and a second body bias region 182.

The layout 180 of FIG. 5D is similar to the layout 170 of FIG. 5C, except that the layout 180 further includes the first body bias region 181 for biasing the body of M1 and the second body bias region 182 for biasing the body of M2. The body biasing regions 181 and 182 run horizontally (orthogonally to the vertical gate regions serving as the gates of M1 and M2) in FIG. 5D.

With reference to FIG. 5D, the bodies of M1 and M2 can be accessed using a T-gate style layout where the region under the gate remains p-type (for an NMOS) and can be connected to a p-type region outside the FET. By using only two gates for the multi-gate, a T-gate configuration can be leveraged to access the body of transistors M1 and M2, each one respectively biased on one side (top and bottom in FIG. 5D). An example of the T-gate biasing 183 for M1 is depicted in FIG. 5D.

Figure 5E:
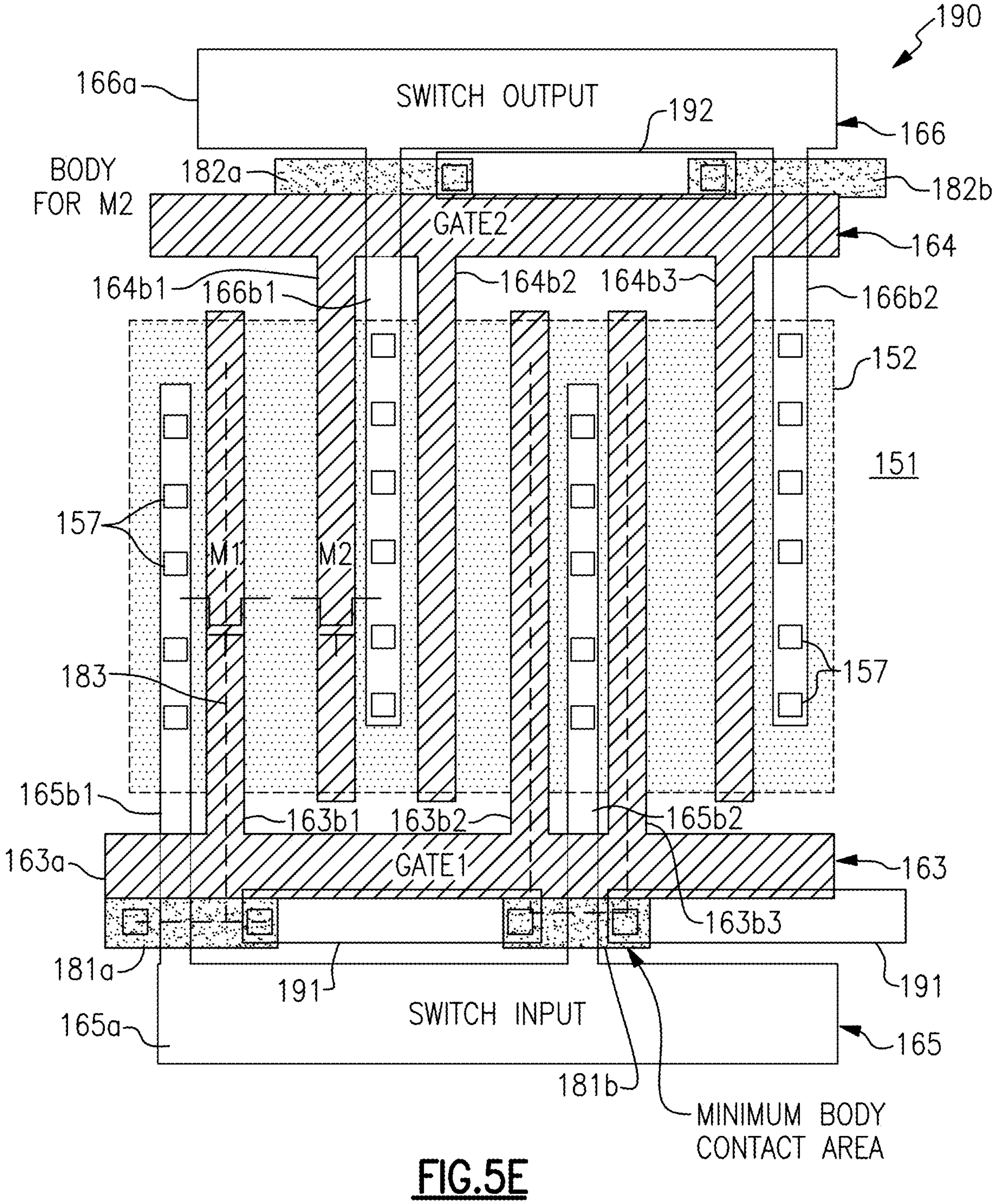
FIG. 5E is a schematic diagram of another embodiment of a layout for an RF switch.

FIG. 5E is a schematic diagram of another embodiment of a layout 190 for an RF switch. The layout 190 includes an active region 152, a first gate structure 163, a second gate structure 164, a switch input 165, a switch output 166, contacts 157, first body bias segments **181*a*/181*b*, second body bias segments 182*a*/182*b*, a first body metal connection 191, and a second body metal connection 192**.

The layout 190 of FIG. 5E is similar to the layout 180 of FIG. 5D, except that the layout 190 of FIG. 5E partitions the first body region into body bias segments **181*a*/181*b* interconnected by the first body metal connection 191, and partitions the second body region into body bias segments 182*a*/182*b* interconnected by the second body metal connection 192**.

To reduce the gate to body capacitance and the body to substrate capacitance, the layout can be implemented with body bias segments that can be small (for example, the minimum possible permitted by technology design rules) and interconnected by metal that joins the body contacts for a particular transistor together.

Figure 5F:
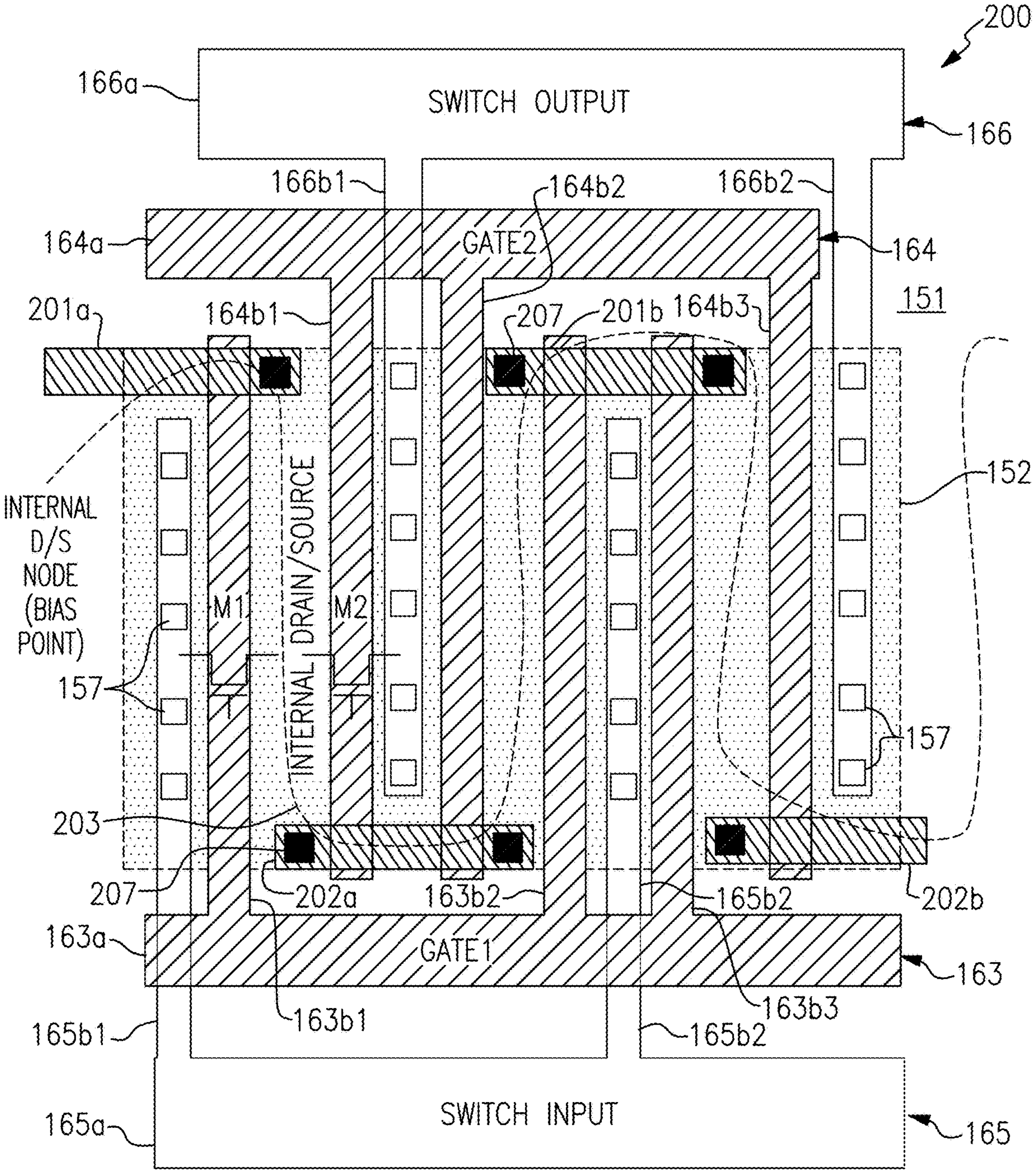
FIG. 5F is a schematic diagram of another embodiment of a layout for an RF switch.

FIG. 5F is a schematic diagram of another embodiment of a layout 200 for an RF switch. The layout 200 includes an active region 152, a first gate structure 163, a second gate structure 164, a switch input 165, a switch output 166, contacts 157, via/contact stacks 207, a first upper drain/source bias region **201*a*, a second upper drain/source bias region 201*b*, a first lower drain/source bias region 202*a*, and a second lower drain/source bias region 202*b***.

The layout 200 of FIG. 5F is similar to the layout 170 of FIG. 5C, except that the layout 200 further includes the upper drain/source bias regions **201*a*/201*b* and the lower drain/source bias regions 202*a*/202*b***, which serve as bridges over the gates.

The drain/source bias regions run horizontally (orthogonally to the vertical gate regions serving as the gates of M1 and M2) in FIG. 5F. Additionally, the FETs M1 and M2 are connected in series between the switch input 165 and the switch output 166, and the internal source/drain node between M1 and M2 is biased by the drain/source bias regions.

Accordingly, the internal drain/source node is biased by adding bridges between each sub-section in a snake pattern 157 to avoid intersecting with the drain/source metal routing.

In certain implementations, the drain/source bias regions are formed in silicide. Bias can be applied and/or resistors can be connected to one end or both ends of the snake to reduce the effective internal resistance from the silicide.

Although silicide can be used in some implementations, in other implementations drain/source bias regions are built in upper metal (for example, metal two or metal three).

Figure 5G:
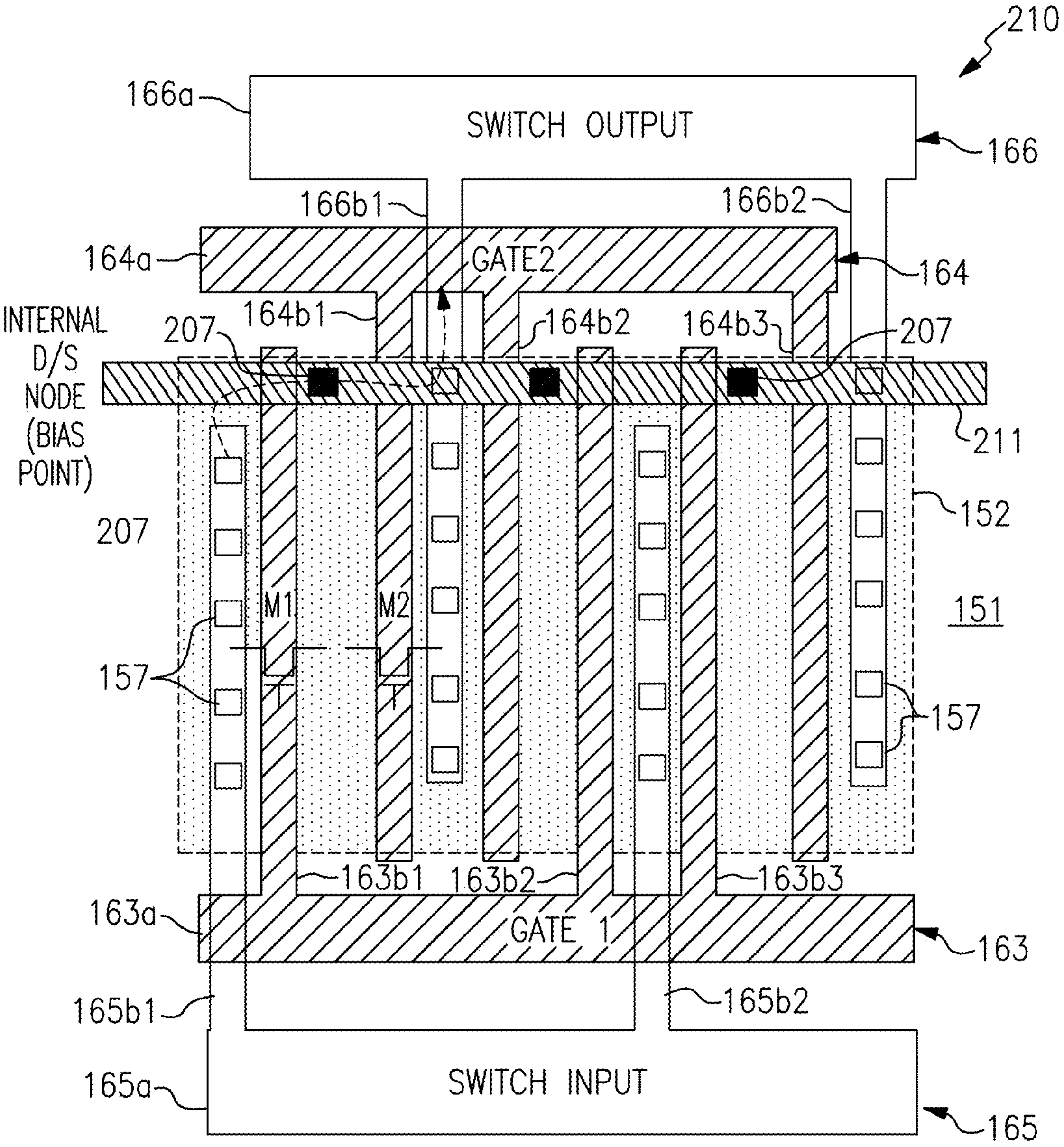
FIG. 5G is a schematic diagram of another embodiment of a layout for an RF switch.

FIG. 5G is a schematic diagram of another embodiment of a layout 210 for an RF switch. The layout 210 includes an active region 152, a first gate structure 163, a second gate structure 164, a switch input 165, a switch output 166, contacts 157, via/contact stacks 207, and a drain/source bias metal connection 211.

The layout 210 of FIG. 5G is similar to the layout 200 of FIG. 5F, except that the layout 210 includes the drain/source bias metal connection 211 for biasing the internal drain/source node between M1 and M2.

In certain implementations, the drain/source bias metal connection 211 includes one or more metal layers (for example, metal two and/or metal three) connected by vias/contacts down to a silicide region. Additionally, overlapping of both the input and output metal traces can be avoided to reduce Cds.

Figure 5H:
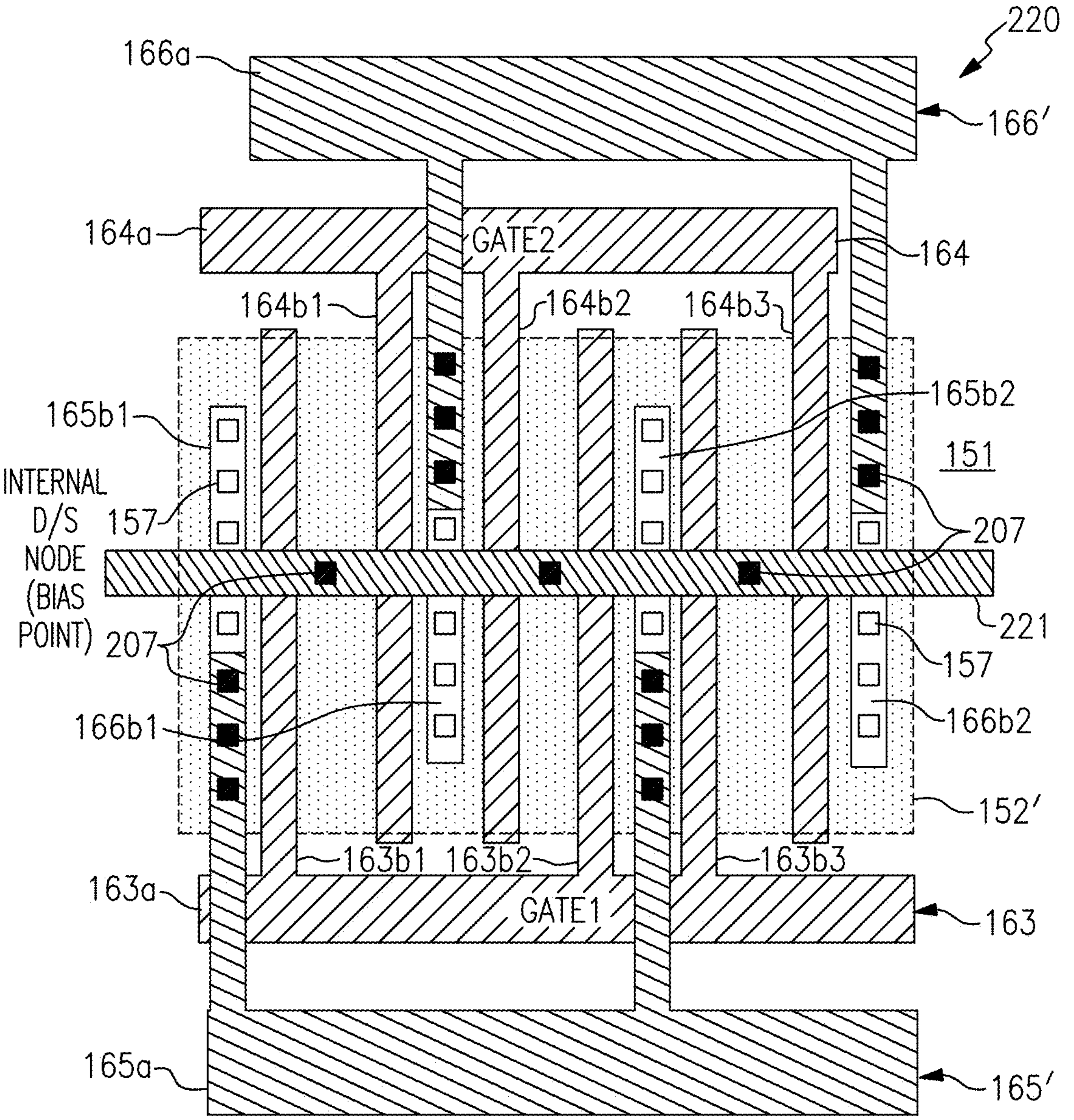
FIG. 5H is a schematic diagram of another embodiment of a layout for an RF switch.

FIG. 5H is a schematic diagram of another embodiment of a layout 220 for an RF switch. The layout 220 includes an active region 152, a first gate structure 163, a second gate structure 164', a switch input 165', a switch output 166, contacts 157, via/contact stacks 207, and a drain/source bias metal connection 221.

The layout 220 of FIG. 5H is similar to the layout 210 of FIG. 5G, except that the layout 220 includes the drain/source bias metal connection 221 for biasing the internal drain/source node between M1 and M2. The drain/source bias metal connection 221 of FIG. 5H is placed in the middle of the FET structure (vertically centered between the switch input and the switch output) to balance coupling to the RF input RFin and the RF output RFout. However, as a downside to the balanced coupling, direct input to output coupling (by way of capacitance coupling through the internal drain/source node) can increase.

In the embodiment of FIG. 5H, the switch input 165' and the switch output 166' also include additional upper metal to reduce gate resistivity.

Figure 5I:
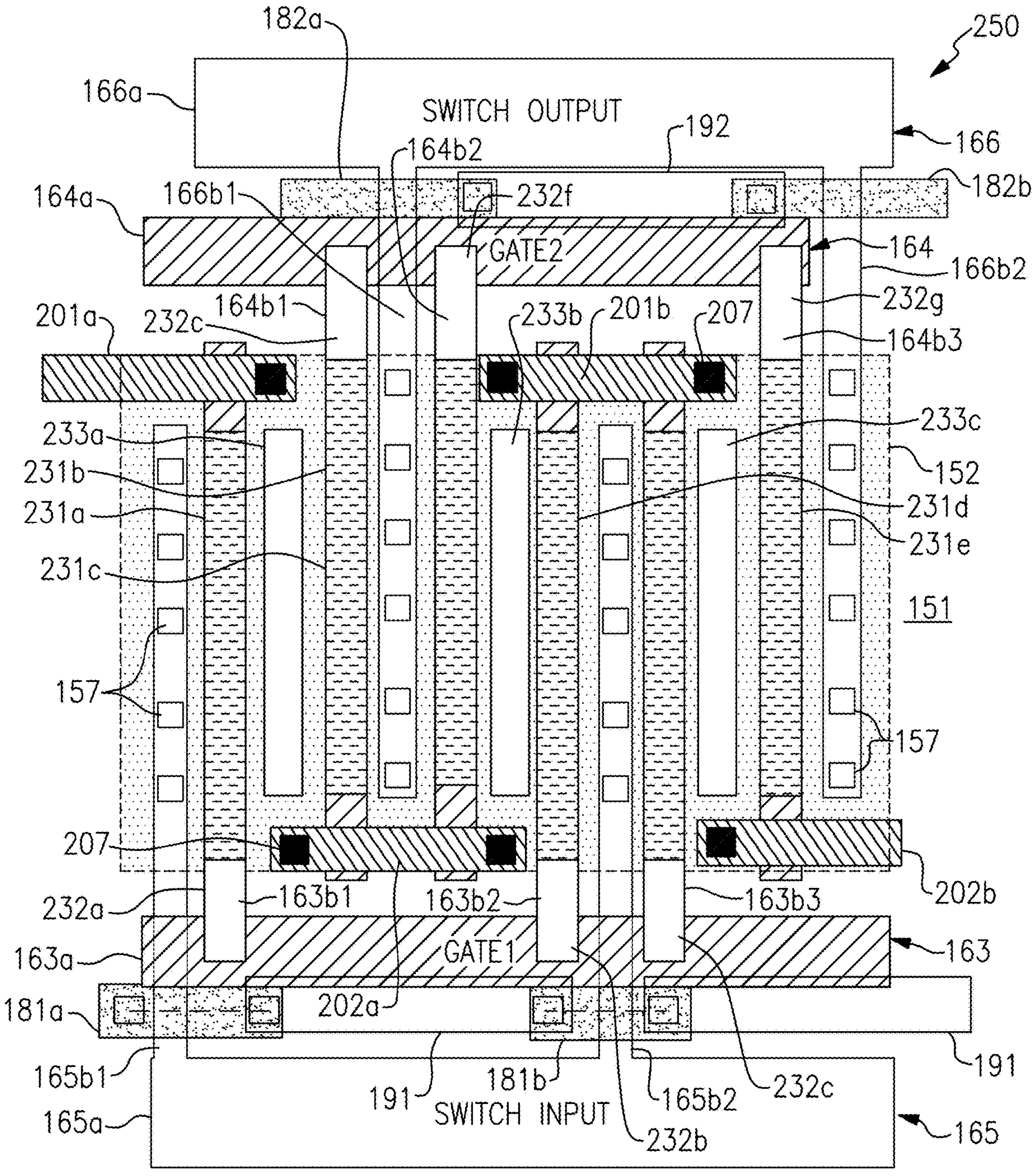
FIG. 5I is a schematic diagram of another embodiment of a layout for an RF switch.

FIG. 5I is a schematic diagram of another embodiment of a layout 230 for an RF switch. The layout 230 includes an active region 152, a first gate structure 163, a second gate structure 164, a switch input 165, a switch output 166, contacts 157, via/contact stacks 207, first body bias segments 181*a*/181*b*, second body bias segments 182*a*/182*b*, a first body metal connection 191, a second body metal connection 192, a first upper drain/source bias region 201*a*, a second upper drain/source bias region 201*b*, a first lower drain/source bias region 202*a*, a second lower drain/source bias region 202*b*, gate air gaps 231*a*/231*b*/231*c*/231*d*/231*e*/231*f* (each positioned over a vertical gate regions serving as a gate of M1 or M2), gate feed air gaps 232*a*/232*b*/232*c*/232*d*/232*e*/232*f* (each positioned over a connection between a vertical gate region and the horizontal gate region), and internal source/drain air gaps 233*a*/233*b*/233*c* (each over the internal source/drain region between M1 and M2).

By adding air gaps, parasitic coupling can be reduced. Such air gaps can be implemented as trenches (filled with air) where metal has been removed between gates and/or outside of the active area where coupling to gate or body can occur.

Figure 5J:
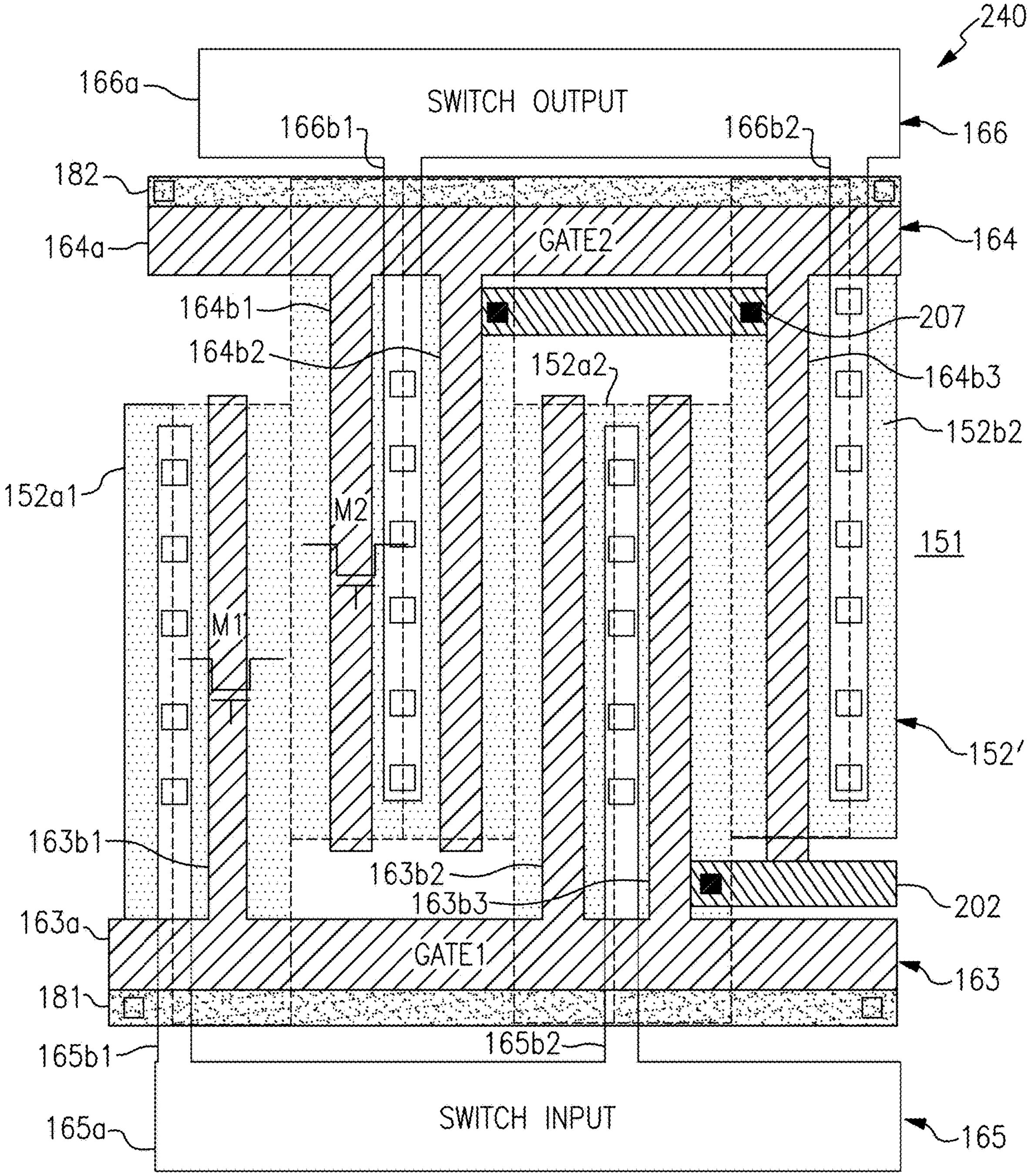
FIG. 5J is a schematic diagram of another embodiment of a layout for an RF switch.

FIG. 5J is a schematic diagram of another embodiment of a layout 240 for an RF switch. The layout includes an active region 152', a first gate structure 163, a second gate structure 164, a switch input 165, a switch output 166, contacts 157, via/contact stacks 207, a first body bias region 181, a second body bias region 182, an upper drain/source bias region 201, and a lower drain/source bias region 202.

As shown in FIG. 5J, the layout 240 includes the active region 152', which includes first active regions 151*al*/151*a*2 for M1 that are offset from second active regions 151*b*1/151*b*2.

Accordingly, the layout 240 includes offset gates for M1 and M2. By implementing the layout 240 in this manner, improved body bias is provided. For example, active region from the channel/gate all the way to the body contact area can be provide with low or minimum parasitic. In certain implementations, silicide is used to provide lower parasitic path/channel for the internal node snake construction.

Figure 6A:
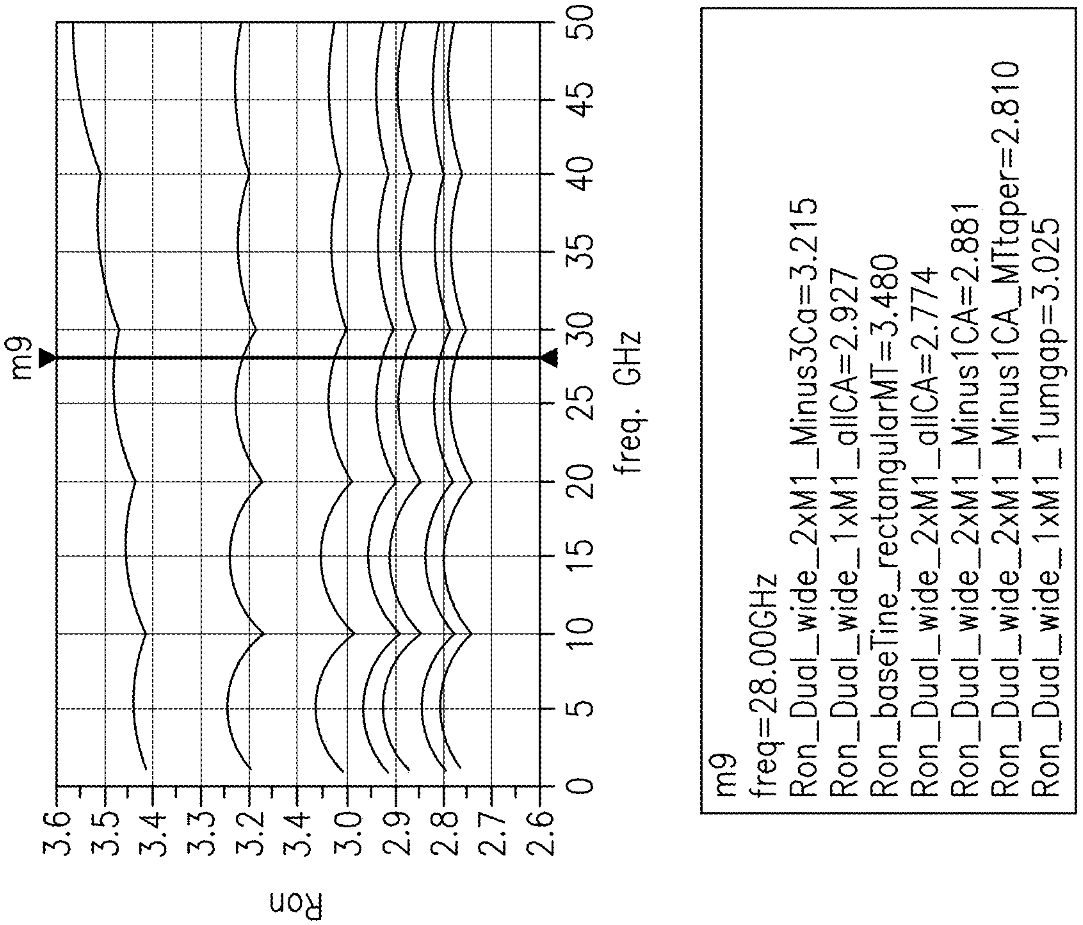
FIG. 6A is a graph of one example of on resistance versus frequency.
Figure 6B:
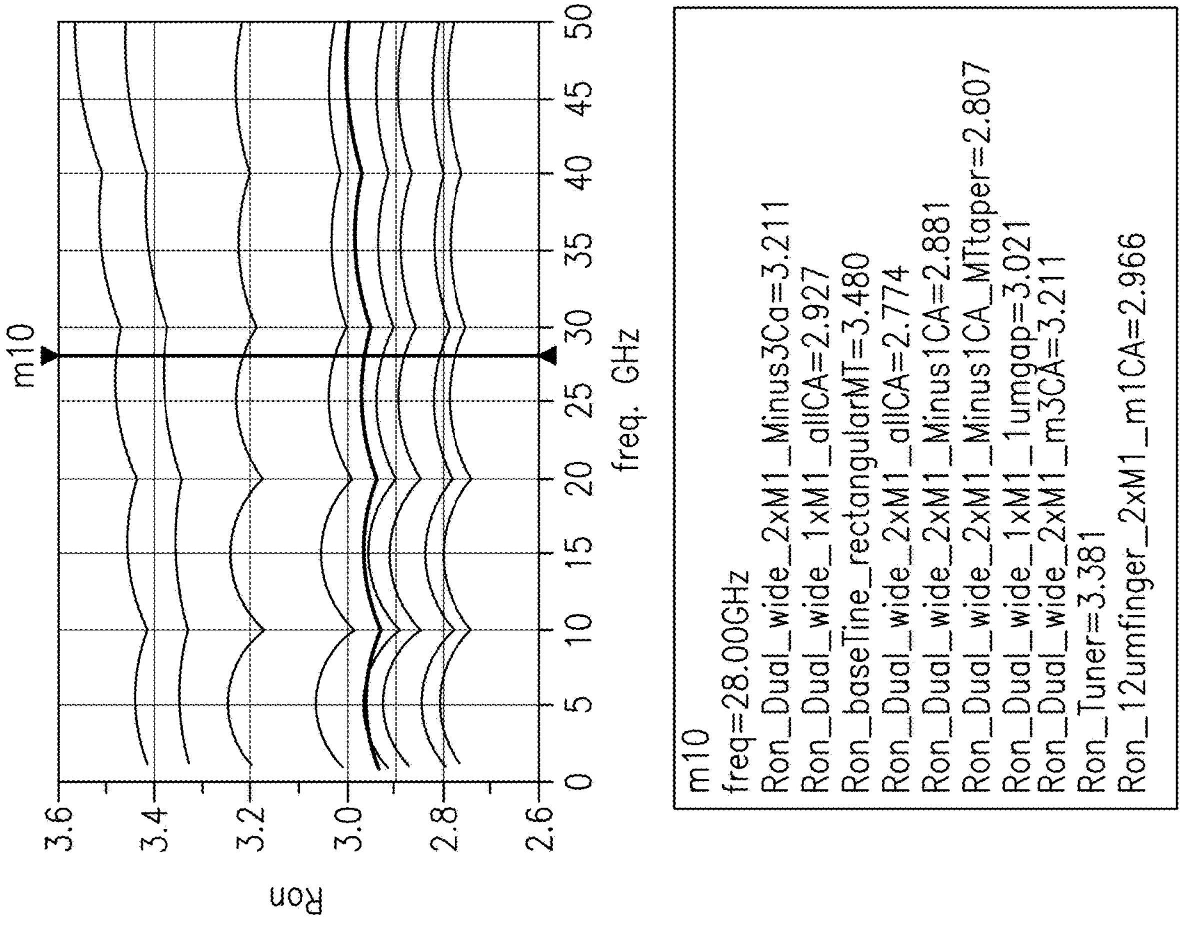
FIG. 6B is a graph of another example of on resistance versus frequency.

FIG. 6A is a graph of one example of on resistance versus frequency. FIG. 6B is a graph of another example of on resistance versus frequency.

The graphs of FIGS. 6A and 6B depict on-state resistance (Ron) in Ohms for various implementations of RF switch layouts. The graphs depict low Ron, which aids in yielding good FOM.

Figure 7A:
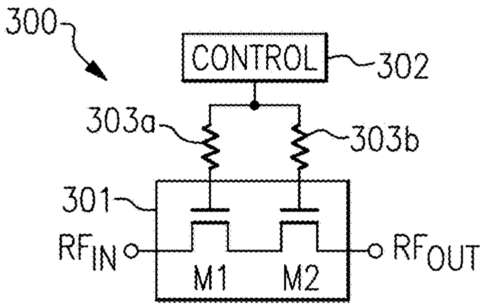
FIG. 7A is a schematic diagram of one embodiment of an RF switch.

FIG. 7A is a schematic diagram of one embodiment of an RF switch 300. The RF switch 300 includes a RF switch cell 301, a control circuit 302, a first gate resistor 303*a*, and a second gate resistor 303*b*.

The RF switch cell 301 includes transistors M1 and M2 in series between an RF input $RF_{IN}$ and an RF output $RF_{OUT}$. The RF switch cell 301 can be implemented in accordance with any of the embodiments herein.

As shown in FIG. 7A, the control circuit 302 turns on or off the RF switch cell 301 by controlling the gate of M1 through gate resistor 303*a* and by controlling the gate of M2 through gate resistor 303*b*. For example, the control circuit 302 can output a control voltage set to a voltage level for turning on or off the RF switch cell 301 as desired.

Figure 7B:
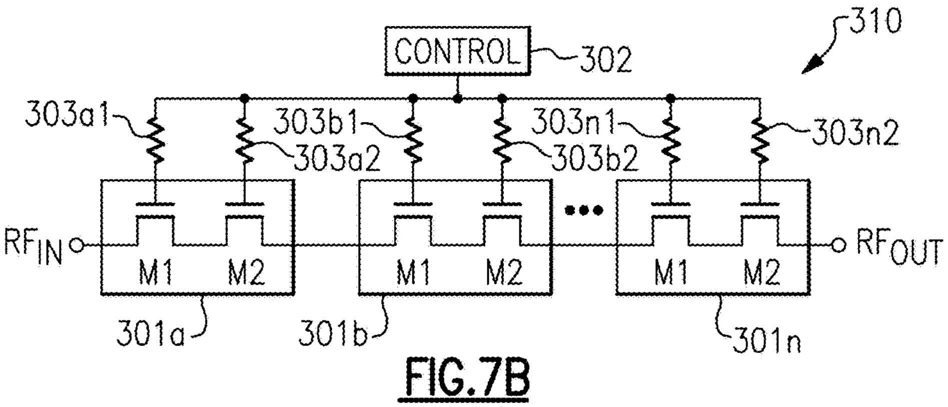
FIG. 7B is a schematic diagram of another embodiment of an RF switch.

FIG. 7B is a schematic diagram of another embodiment of an RF switch 310. The RF switch 310 includes RF switch cells 301*a*, 301*b*, . . . 301*n*, a control circuit 302, first gate resistors 303*al*, 303*b*1, . . . 303*n*1, and second gate resistor 303*a*2, 303*b*2, . . . 303*n*2.

In comparison to the RF switch 300 of FIG. 7A, the RF switch 310 of FIG. 7B includes multiple (any number n) RF switch cells in series for enhanced power handling capability. Any number of RF switch cells can be placed in series for higher power handling.

Figure 7C:
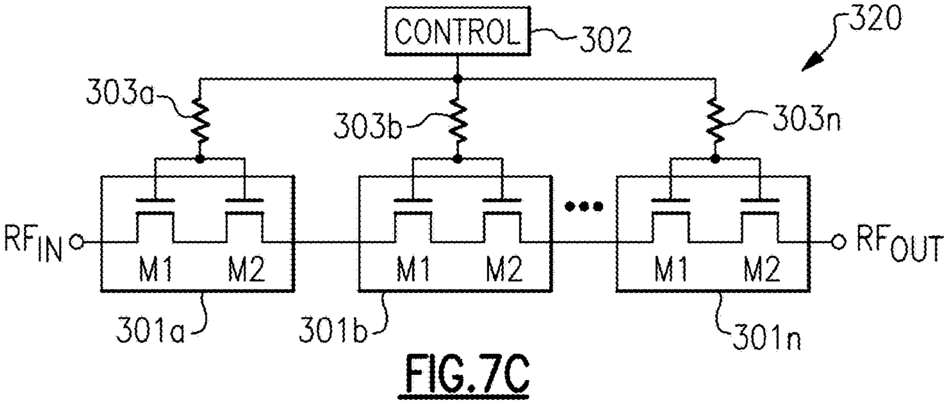
FIG. 7C is a schematic diagram of another embodiment of an RF switch.

FIG. 7C is a schematic diagram of another embodiment of an RF switch 320. The RF switch 320 includes RF switch cells 301*a*, 301*b*, . . . 301*n*, a control circuit 302, and gate resistors 303*a*, 303*b*, . . . 303*n*.

In comparison to the RF switch 310 of FIG. 7B, the RF switch 320 of FIG. 7C shares a gate resistor for the gate of M1 and M2 of a given RF switch cell. Such a configuration can be suitable, for example, for implementations such as that shown in FIG. 5A in which the gates of M1 and M2 are shorted within the layout of a given cell.

Figure 7D:
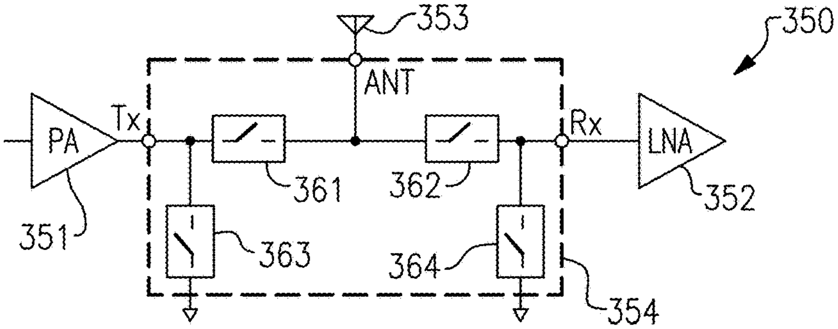
FIG. 7D is a schematic diagram of one embodiment of a front-end system.

FIG. 7D is a schematic diagram of one embodiment of a front-end system 350. The front-end system 350 includes a power amplifier 351, a low noise amplifier 352, an antenna 353, and a transmit/receive (T/R) switch 354.

The T/R switch 354 includes a first series RF switch 361 between the output of the power amplifier 351 and the antenna 353, a second series RF switch 362 between the antenna 353 and the input of the low noise amplifier 352, a first shunt RF switch 363 between the output of the power amplifier 351 and ground, and a second shunt RF switch 364 between the input of the low noise amplifier 352 and ground.

Any combination of the first series RF switch 361, the second series RF switch 362, the first shunt RF switch 363, and/or the second shunt RF switch 364 can be implemented using one or more RF switch cells implemented in accordance with the teachings herein.

Figure 8:
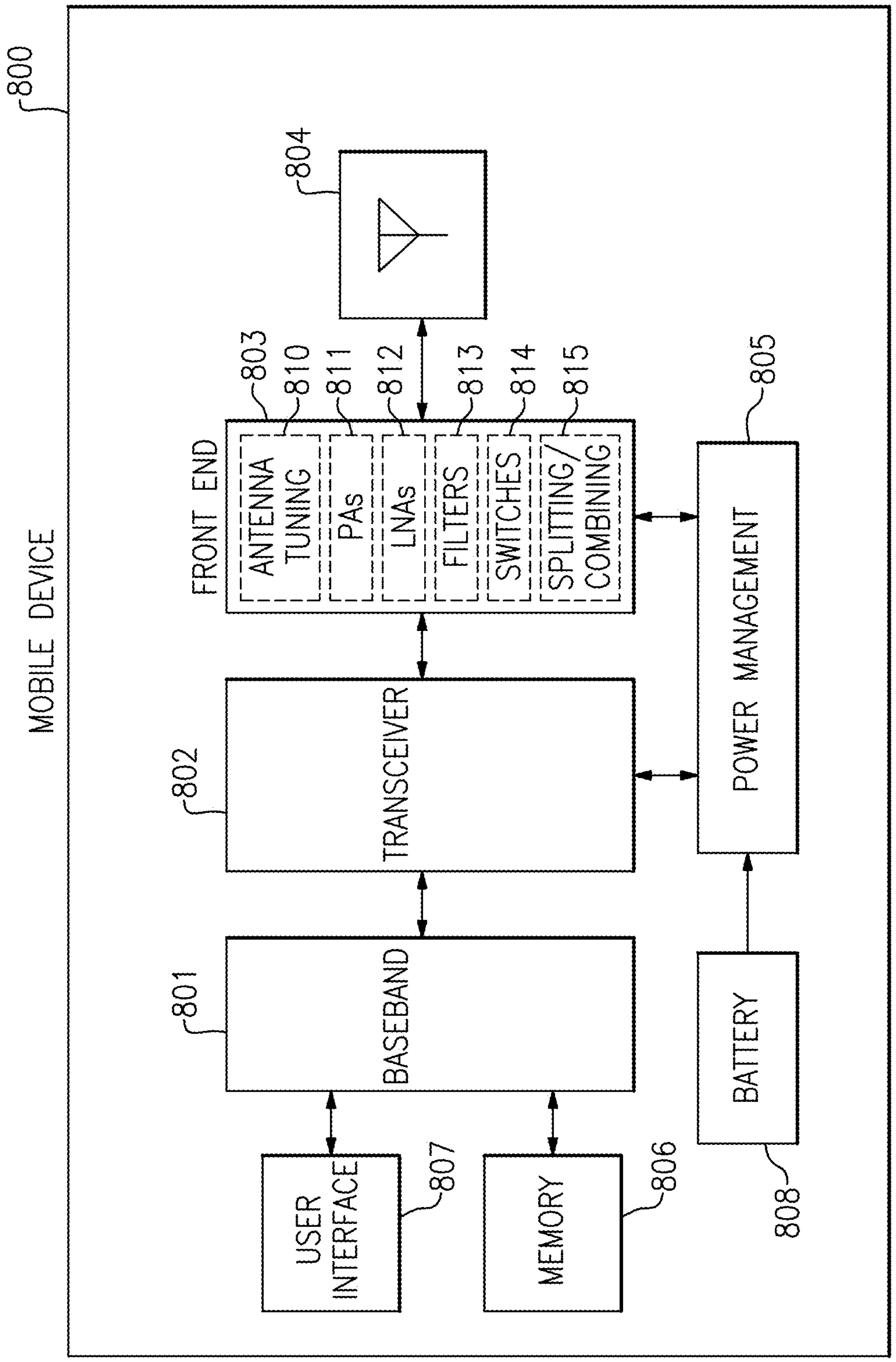
FIG. 8 is a schematic diagram of one embodiment of a mobile device.

FIG. 8 is a schematic diagram of one embodiment of a mobile device 800. The mobile device 800 includes a baseband system 801, a transceiver 802, a front-end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front-end system 803 aids in conditioning signals transmitted to and/or received from the antennas 804. In the illustrated embodiment, the front-end system 803 includes antenna tuning circuitry 810, power amplifiers (PAs) 811, low noise amplifiers (LNAs) 812, filters 813, switches 814, and signal splitting/combining circuitry 815. However, other implementations are possible. Any of the switches 814 can be implemented in accordance with the teachings herein.

The front-end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front-end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Figure 9:
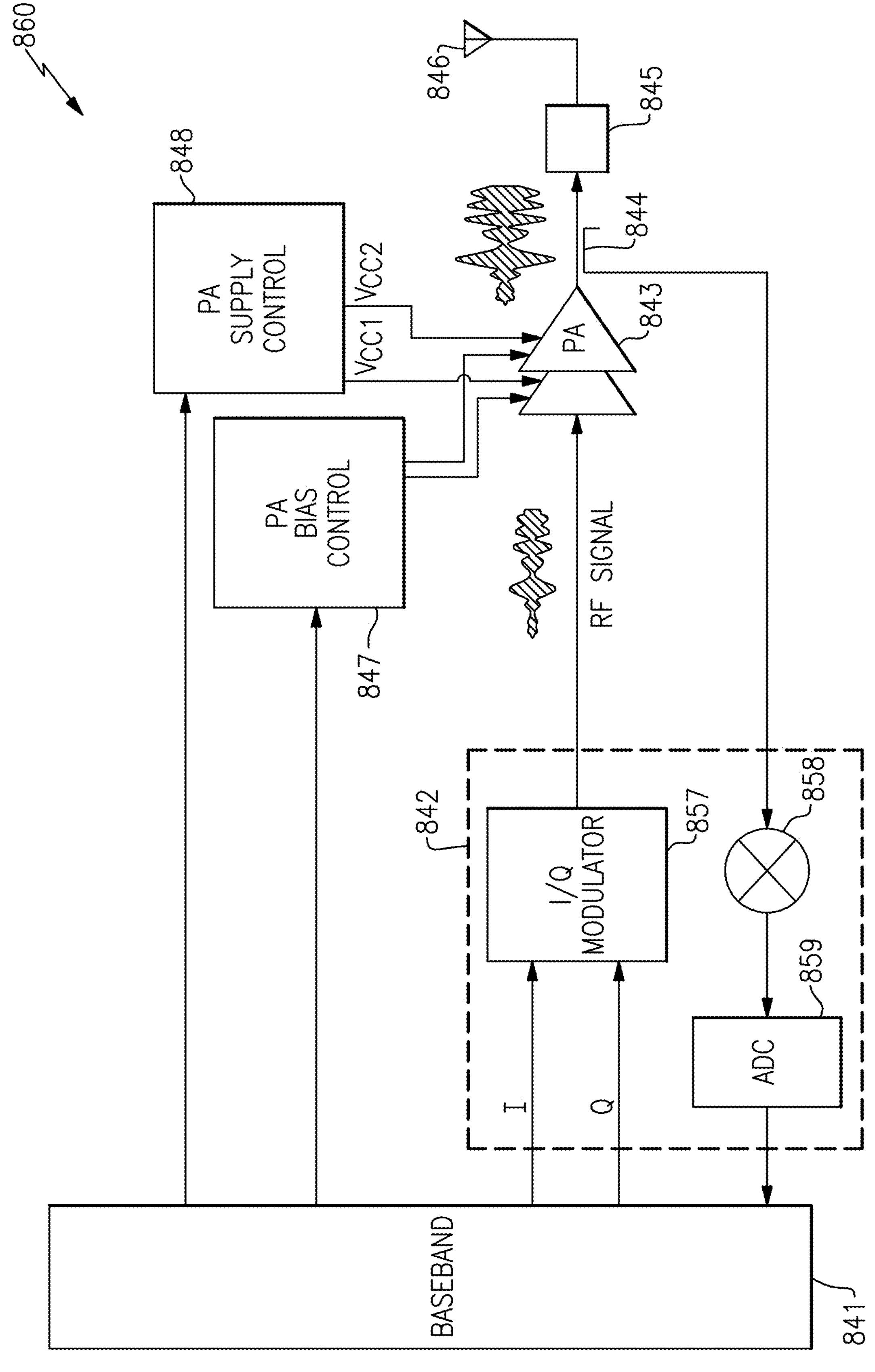
FIG. 9 is a schematic diagram of a power amplifier system according to one embodiment.

FIG. 9 is a schematic diagram of a power amplifier system 860 according to one embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 841 can be included in the power amplifier system 860.

The I/Q modulator 857 can be configured to receive the I and Q signals from the baseband processor 841 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be a push-pull amplifier implemented in accordance with any of the embodiments herein.

The front-end circuitry 845 can be implemented in a wide variety of ways. In one example, the front-end circuitry 845 includes one or more switches, filters, duplexers, multiplexers, and/or other components. Any of the switches of the front-end circuitry 845 can be implemented in accordance with the teachings herein.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 9, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 10A:
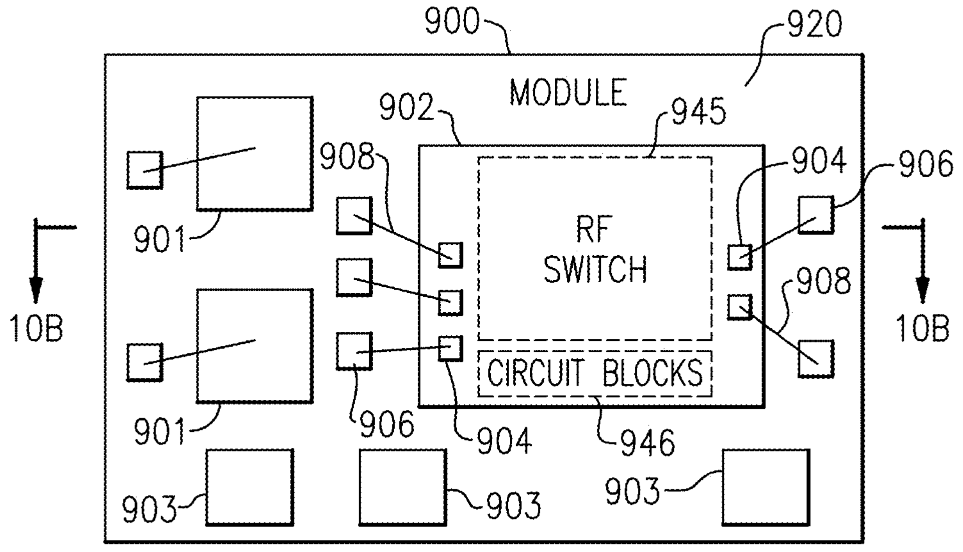
FIG. 10A is a schematic diagram of one embodiment of a packaged module.
Figure 10B:
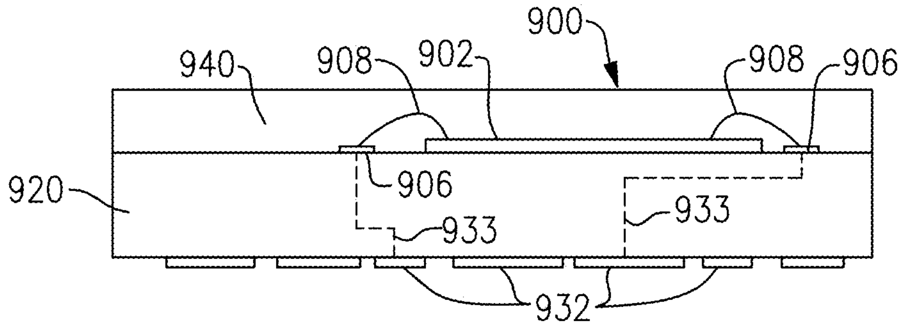
FIG. 10B is a schematic diagram of a cross-section of the packaged module of FIG. 10A taken along the lines 10B-10B.

FIG. 10A is a schematic diagram of one embodiment of a packaged module 900 (also referred to herein as a radio frequency module). FIG. 10B is a schematic diagram of a cross-section of the packaged module 900 of FIG. 10A taken along the lines 10B-10B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a radio frequency switch 945 and one or more front end circuit blocks 946 that are connected to the radio frequency switch 945. The semiconductor die 902 can be implemented in accordance with any of the features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 10B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 10B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

The principles and advantages of the embodiments herein can be used for any other systems or apparatus that have needs for RF switches. Examples of such apparatus include RF communication systems such as mobile phones, tablets, base stations, network access points, customer-premises equipment (CPE), laptops, and wearable electronics. Thus, the RF switches herein can be included in various electronic devices, including, but not limited to, consumer electronic products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency switch comprising:

a first transistor gate structure including a first gate connection extending in parallel with a first edge of a shared active region, and a first transistor gate extending from the first gate connection over the first edge of the shared active region and over a second edge of the shared active region opposite the first edge;

a second transistor gate structure including a second gate connection extending in parallel with the second edge of the active region opposite the first edge, and a second transistor gate extending from the second gate connection over the second edge of the active region and over the first edge of the shared active region;

a radio frequency switch input including a first source/drain connection extending in parallel to the first transistor gate and contacting the shared active region; and a radio frequency switch output including a second source/drain connection extending in parallel to the second transistor gate and contacting the shared active region, the first transistor gate and the second transistor gate positioned between the first source/drain connection and the second source/drain connection.

2. The radio frequency switch of claim 1 wherein the first source/drain connection does not reach the second edge of the shared active region, and the second source/drain connection does not reach the first edge of the shared active region.

3. The radio frequency switch of claim 1 wherein the first gate connection, the first transistor gate, the second gate connection, and the second transistor gate are formed of polysilicon.

4. The radio frequency switch of claim 1 wherein the shared active region is rectangular.

5. The radio frequency switch of claim 1 wherein the shared active region includes a first rectangular region and a second rectangular region, the first rectangular region abutting but offset from the second rectangular region.

6. The radio frequency switch of claim 5 wherein the first transistor gate extends over the first rectangular region, and the second transistor gate extends over the second rectangular region.

7. The radio frequency switch of claim 1 further comprising an internal drain/source bias region extending in parallel to the second edge of the shared active region, the internal drain/source bias region contacting the shared active region between the first transistor gate and the second transistor gate.

8. The radio frequency switch of claim 1 wherein the shared active region is formed in a semiconductor, the radio frequency switch further including a body contact region that contacts the semiconductor adjacent to the first edge of the shared active region.

9. The radio frequency switch of claim 8 wherein the body contact region includes a plurality of body contacts bridged by metal.

10. The radio frequency switch of claim 8 wherein a body contact is present only on one side of the shared active region.

11. A mobile device comprising:

an antenna; and a front-end system coupled to the antenna and including a radio frequency switch, the radio frequency switch including a first transistor gate structure that includes a first gate connection extending in parallel with a first edge of a shared active region and a first transistor gate extending from the first gate connection over the first edge of the shared active region and over a second edge of the shared active region opposite the first edge, a second transistor gate structure that includes a second gate connection extending in parallel with a second edge of the shared active region opposite the first edge and a second transistor gate extending from the second gate connection over the second edge of the shared active region and over the first edge of the shared active region, a radio frequency switch input that includes a first source/drain connection extending in parallel to the first transistor gate and contacting the shared active region, and a radio frequency switch output that includes a second source/drain connection extending in parallel to the second transistor gate and contacting the shared active region, the first transistor gate and the second transistor gate positioned between the first source/drain connection and the second source/drain connection.

12. The mobile device of claim 11 wherein the front-end system further includes a power amplifier having an output connected to the radio frequency switch input.

13. The mobile device of claim 11 wherein the front-end system further includes a low noise amplifier having an input connected to the radio frequency switch output.

14. A packaged module comprising:

a package substrate; and a semiconductor die attached to the package substrate and including a radio frequency switch formed thereon, the radio frequency switch including a first transistor gate structure that includes a first gate connection extending in parallel with a first edge of a shared active region and a first transistor gate extending from the first gate connection over the first edge of the shared active region and over a second edge of the shared active region opposite the first edge, a second transistor gate structure that includes a second gate connection extending in parallel with a second edge of the shared active region opposite the first edge and a second transistor gate extending from the second gate connection over the second edge of the shared active region and over the first edge of the shared active region, a radio frequency switch input that includes a first source/drain connection extending in parallel to the first transistor gate and contacting the shared active region, and a radio frequency switch output that includes a second source/drain connection extending in parallel to the second transistor gate and contacting the shared active region, the first transistor gate and the second transistor gate positioned between the first source/drain connection and the second source/drain connection.

15. The packaged module of claim 14 wherein the first source/drain connection does not reach the second edge of the shared active region, and the second source/drain connection does not reach the first edge of the shared active region.

16. The packaged module of claim 14 wherein the first gate connection, the first transistor gate, the second gate connection, and the second transistor gate are formed of polysilicon.

17. The packaged module of claim 14 wherein the shared active region is rectangular.

18. The packaged module of claim 14 wherein the shared active region includes a first rectangular region and a second rectangular region, the first rectangular region abutting but offset from the second rectangular region.

19. The packaged module of claim 18 wherein the first transistor gate extends over the first rectangular region, and the second transistor gate extends over the second rectangular region.

20. The packaged module of claim 14 further comprising an internal drain/source bias region extending in parallel to the second edge of the shared active region, the internal drain/source bias region contacting the shared active region between the first transistor gate and the second transistor gate.

* * * * *